(12) United States Patent
Ohkawa et al.

(10) Patent No.: US 7,192,625 B2
(45) Date of Patent: Mar. 20, 2007

(54) MANUFACTURING METHOD OF BARRIER-FORMING FILM

(75) Inventors: Koujiro Ohkawa, Tokyo-to (JP); Atsuo Tsuzuki, Tokyo-to (JP); Kuniaki Yoshikata, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 10/785,259

(22) Filed: Feb. 24, 2004

(65) Prior Publication Data

US 2004/0166239 A1    Aug. 26, 2004

Related U.S. Application Data

(62) Division of application No. 10/148,627, filed as application No. PCT/JP01/08947 on Oct. 11, 2001, now Pat. No. 6,720,097.

(30) Foreign Application Priority Data

Oct. 13, 2000  (JP) .............................. 2000-313003
Sep. 3, 2001   (JP) .............................. 2001-265308

(51) Int. Cl.
    *C23C 16/40*    (2006.01)
(52) U.S. Cl. ........................ 427/255.29; 427/255.31; 427/376.2

(58) Field of Classification Search ........... 427/255.29, 427/255.31, 376.2
See application file for complete search history.

(56) References Cited

U.S. PATENT DOCUMENTS

| | | | | |
|---|---|---|---|---|
| 4,904,526 A * | 2/1990 | Koskenmaki | ............... | 428/328 |
| 5,156,720 A * | 10/1992 | Rosenfeld et al. | ............ | 205/76 |
| 5,512,540 A * | 4/1996 | Yamazaki | .................. | 505/325 |
| 5,902,638 A * | 5/1999 | Vakil | ....................... | 427/248.1 |
| 5,976,966 A * | 11/1999 | Inoue | ........................ | 438/618 |
| 6,395,381 B1 * | 5/2002 | Kondo et al. | ............. | 428/317.9 |
| 6,492,215 B1 * | 12/2002 | Kishi | ....................... | 438/197 |
| 6,770,176 B2 * | 8/2004 | Benson et al. | ......... | 204/192.22 |
| 2002/0001963 A1* | 1/2002 | Tadokoro et al. | ........... | 438/710 |
| 2003/0124392 A1* | 7/2003 | Bright | ....................... | 428/698 |

\* cited by examiner

*Primary Examiner*—Bret Chen
(74) *Attorney, Agent, or Firm*—Ladas & Parry LLP

(57) ABSTRACT

In manufacturing a barrier-forming film, a vapor-deposited inorganic oxide film is provided on a face of a substrate film. An annealing treatment is applied to the substrate film having said vapor-deposited inorganic film. The substrate film is a resinous film which selected from a group consisting of polyesters, polyamides and polypropylenes. The annealing treatment includes a heating treatment carried out at a temperature within the range from 55° C. to 150° C. in order to cause thermal shrinkage of the substrate film and to increase density of the vapor-deposited inorganic oxide film. The vapor-deposited inorganic oxide film includes a vapor-deposited silicon oxide film or a vapor-deposited aluminum oxide film.

6 Claims, 9 Drawing Sheets

MANUFACTURING METHOD OF BARRIER-FORMING FILM

This application is a division of U.S. Ser. No. 10/148,627 filed May 31, 2002 (issued as U.S. Pat. No. 6,720,097 on Apr. 13, 2004), which is a completion of International Application PCT/JP01/08947 filed Oct. 11, 2001.

TECHNICAL FIELD

The present invention relates to a barrier-forming film and a manufacturing method thereof. More particularly, the invention relates to a barrier-forming film which has a higher barrier-formability preventing permeation of oxygen gas, steam or the like and is useful for manufacturing various packaging containers and a manufacturing method thereof.

BACKGROUND ART

For the purpose of filling-packaging eatables and drinkables, chemicals and the like, packaging containers of various forms have conventionally been developed and proposed. In these packaging containers, barrier-forming materials of various forms including plastic films are usually used as materials composing packaging containers with a view to preventing deterioration of contents, and in addition, improving shelf life and storage life.

More recently, the general attention is attracted to a transparent barrier-forming film having a vapor-deposited inorganic oxide film such as silicon oxide or aluminum oxide provided on a side of a substrate film comprising a biaxially oriented polyethyleneterephthalate film or a biaxially oriented nylon film as one of barrier-forming materials, and packaging containers of various forms using such a material have been developed and proposed.

As compared with conventional barrier-forming materials comprising a plastic film such as a polyvinylidene chloride-based resin or a polyvinylalcohol-based resin or a barrier-forming material comprising a metal layer having a resin film having a vapor-deposited aluminum film, the recently developed and proposed one has a function of barrier-formability equal to or even superior to that in the conventional art in terms of barrier-formability of preventing permeation of oxygen gas and steam, particularly excellent in disposability of waste container packages. For example, the new barrier-forming material is excellent in advantage for coping with environments in that it does not cause ecocide even when applying disposal such as incineration, so that an increasing use and demand are expected hereafter as a barrier-forming material for making packaging containers.

However, in a transparent barrier-forming film comprising, as a barrier-forming material, having a vapor-deposited silicon oxide, aluminum oxide, or other inorganic oxide film formed on one side of a substrate film made of the above-mentioned biaxially oriented polyethyleneterephthalate or biaxially oriented nylon, it is very difficult to prepare vapor-depositing conditions including, for example, the kind of substrate film, the vapor-depositing rate, the chemical composition of vapor-depositing pressure, the vapor-depositing gas flow rate, the degree of vacuum, the vapor deposition output, the temperature upon vapor deposition and the like. Film forming of a vapor-deposited film of an inorganic oxide such as silicon oxide or aluminum oxide alone cannot ensure manufacture of a barrier-forming material excellent in prevention of permeation of oxygen gas or steam.

For example, in order to manufacture a barrier-forming film having constant and stable function of preventing permeation of oxygen gas or steam, which is the most important function as a barrier-forming material, therefore, it is very difficult to work out vapor-depositing conditions: problems are often caused in that there occur fluctuations between product lots or rejects are produced in a large quantity.

In the transparent barrier-forming film having a vapor-deposited film of an inorganic oxide such as silicon oxide or aluminum oxide formed on one side of a substrate film comprising a biaxially oriented polyethyleneterephthalate film or a biaxially oriented nylon film, in terms of barrier-formability, the steam permeability is substantially 10.0 $g/m^2$.day, and the oxygen permeability is about 10.0 $cc/m^2$.day.atm. It is therefore practically difficult to manufacture a transparent barrier-forming film having a steam permeability of up to 5.0 $g/m^2$.day and an oxygen permeability of up to 5.0 $cc/m^2$.day.atm.

Furthermore, in the case of a transparent barrier-forming film using a transparent biaxially oriented polyethyleneterephthalate film or a biaxially oriented nylon film and having a vapor-deposited film of an inorganic oxide such as silicon oxide, the product is a yellowish or yellow-brownish barrier-forming film, although the reason is not as yet known. This results in a problem in that it impairs transparency or decorativeness by printed patterns, thus preventing a satisfactory packaging material or a packaging container from being manufactured.

The present invention has therefore an object to provide a barrier-forming film which has a high barrier-formability for preventing permeation of oxygen gas or steam, and is useful for manufacturing various packaging container.

DISCLOSURE OF INVENTION

After carrying out repeated study efforts about the above-mentioned transparent barrier-forming film, the present inventor took note of the fact that, in a transparent barrier-forming film having a vapor-deposited film of an inorganic oxide such as silicon oxide or aluminum oxide formed on one side of a substrate film comprising the above-mentioned biaxially oriented polyethyleneterephthalate film or a biaxially oriented nylon film, the substrate film thermally shrank and the yellowish or yellow-brownish color tone of the vapor-deposited film of the inorganic oxide changed by applying an annealing treatment comprising a heat treatment. First, they manufactured a transparent barrier-forming film by forming a vapor-deposited film of an inorganic oxide such as silicon oxide or aluminum oxide on one side of the substrate film of the above-mentioned biaxially oriented polyethyleneterephthalate film or biaxially oriented nylon film. Then, an annealing treatment comprising a heating treatment of setting a heat treatment temperature of at least room temperature and holding the object in an oven for 24 hours was applied to the transparent barrier-forming film. The substrate film composing the transparent barrier-forming film shrank and the vapor-deposited inorganic oxide film became denser. Furthermore, the yellowish or yellow-brownish tone upon forming the vapor-deposited inorganic oxide film changed, bringing about an improvement of the degree of yellowing from the yellowish or yellow-brownish tone upon film forming, thus increasing transparency. The amount of change in X-value of the inorganic oxide such as silicon oxide or aluminum oxide as expressed by a formula MOx for composing the vapor-deposited inorganic oxide (where, M represents a metal element; the range of values of X varies between metal elements) increases slightly, In addition, there was a change in surface roughness of the vapor-deposited inorganic oxide film. The barrier-formability for preventing permeation of oxygen gas or steam was remarkably improved as a barrier-forming material forming a packaging container. The present inventor thus obtained findings of the possibility to manufacture a barrier-forming film useful for manufacturing various packaging containers, and completed the present invention.

More specifically, the present invention relates to a barrier-forming film comprising a substrate film having a vapor-deposited inorganic oxide film, subjected to an annealing treatment, wherein the steam permeability is within a range of from 2.0 to 0.000001 $g/m^2 \cdot day$, and the oxygen permeability is within a range of from 2.0 to 0.000001 $cc/m^2 \cdot day \cdot atm$, and a manufacturing method thereof.

BEST MODE FOR CARRYING OUT THE INVENTION

The present invention will now be described further in detail with reference to the drawings.

Figure 1:
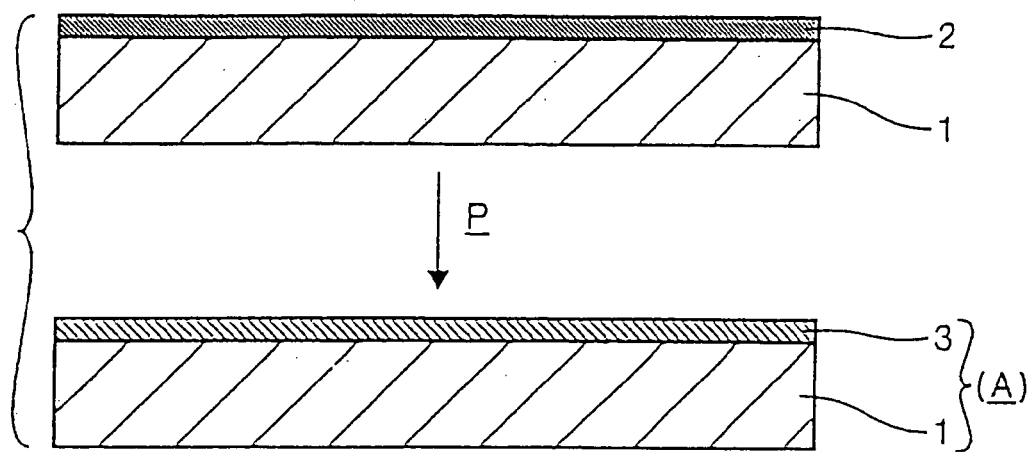
FIG. 1 is a schematic sectional view illustrating a typical layer configuration of the barrier-forming film of the present invention.
Figure 2:
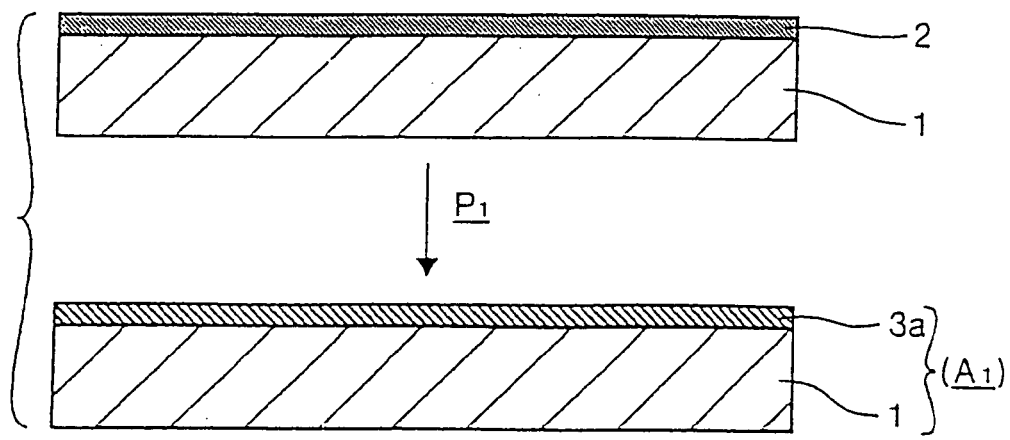
FIG. 2 is a schematic sectional view illustrating a typical layer configuration of the barrier-forming film of the invention.

The barrier-forming film of the invention will first be described by means of a typical layer configuration with reference to the drawings. FIGS. 1 and 2 are schematic sectional views illustrating layer configurations 1 and 2 of the barrier-forming film of the invention.

In the present invention, the barrier-forming film A of the invention has a basic structure, as shown in FIG. 1, in which a vapor-deposited film 2 of an inorganic oxide such as silicon oxide or aluminum oxide is provided on one side of a substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the vapor-deposited film 2 of the above-mentioned inorganic oxide, a vapor-deposited film 3 of an inorganic oxide prepared by reforming the properties, as shown by an arrow P, including the steam permeability, the oxygen permeability, the degree of yellowing of the color tone, the amount of change in X-value of the inorganic oxide as expressed by a formula MOx composing the vapor-deposited film of an inorganic oxide (where, M represents a metal element; the range of value of X varies with the metal element), the surface roughness of the vapor-deposited film of an inorganic oxide and shrinkage of the substrate film.

More specifically, as shown in FIG. 2, a typical example of the barrier-forming film of the invention is a barrier-forming film A1 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3a of an inorganic oxide prepared by reforming the properties, as shown by an arrow P1, so that the steam permeability is within a range of from 2.0 to 0.000001 $g/m^2 \cdot day$, and the oxygen permeability is within a range of from 2.0 to 0.000001 $cc/m^2 \cdot day \cdot atm$.

Figure 3:
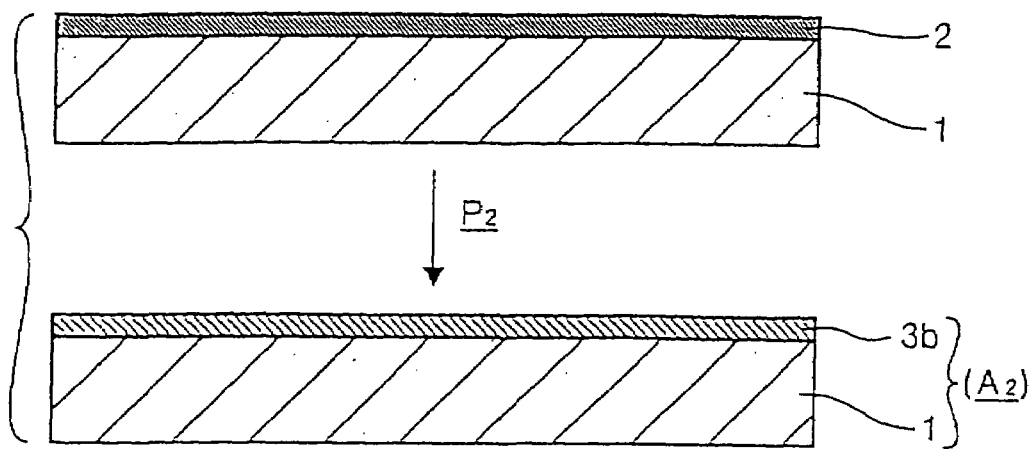
FIG. 3 is a schematic sectional view illustrating a typical layer configuration of the barrier-forming film of the invention.

Another example of the barrier-forming film of the invention is, as shown in FIG. 3, a barrier-forming film A2 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3b of an inorganic oxide prepared by reforming the properties, as shown by an arrow P2, so that the improvement ratio of steam permeability is within a range of from 1/100 to 99/100, and the improvement ratio of oxygen permeability is within a range of from 1/100 to 99/100 as compared with those before the annealing treatment.

In the above description, the term the improvement ratio of steam permeability means [improvement ratio=(steam permeability after annealing treatment÷steam permeability before annealing treatment)]. The term the improvement ratio of oxygen permeability means [improvement ratio=(oxygen permeability after annealing treatment÷oxygen permeability before annealing treatment)].

Figure 4:
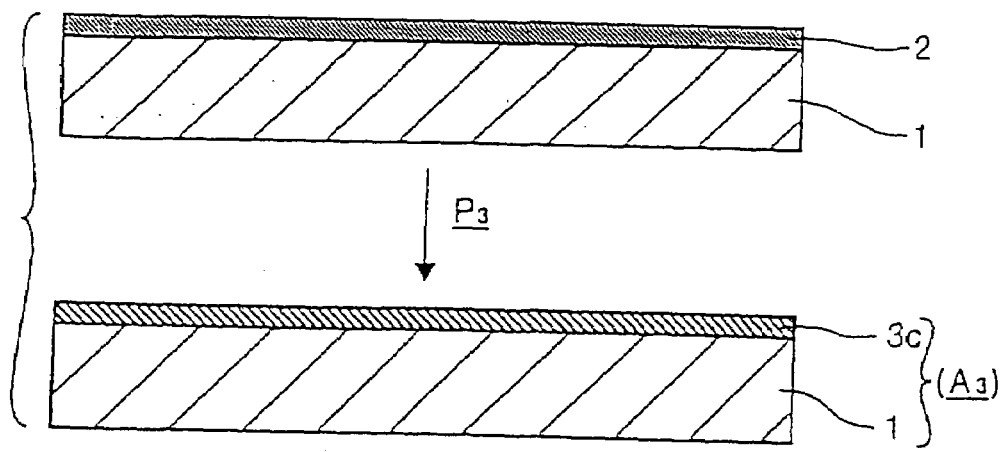
FIG. 4 is a schematic sectional view illustrating a typical layer configuration of the barrier-forming film of the invention.

Still another example of the barrier-forming film of the invention is, as shown in FIG. 4, a barrier-forming film A3 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3c of an inorganic oxide prepared by reforming the properties, as shown by an arrow P3, so that the amount of decrease in steam permeability is improved to a range of from −0.1 to −30 g/m².day, and the amount of decrease in oxygen permeability is improved to a range of from −0.1 to −10 cc/m².day.atm, as compared with those before the annealing treatment.

Figure 5:
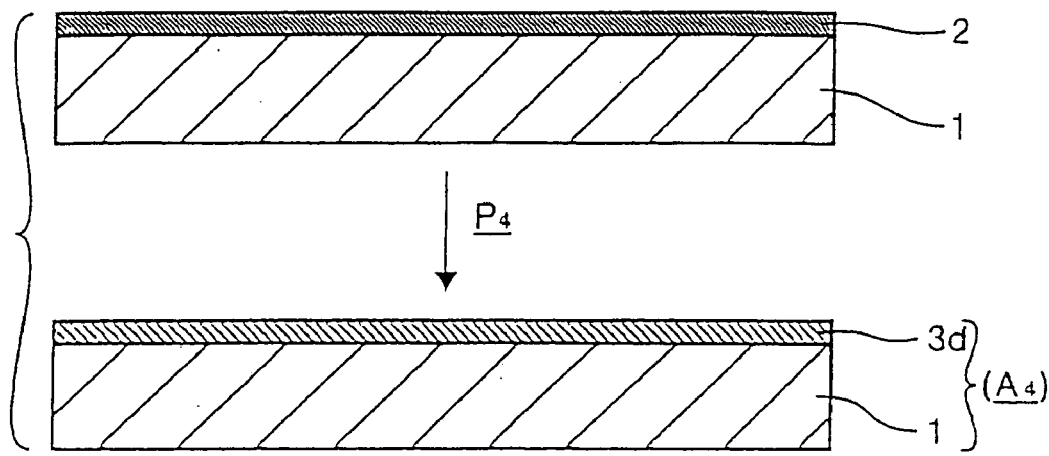
FIG. 5 is a schematic sectional view illustrating a typical layer configuration of the barrier-forming film of the invention.

Another example of the barrier-forming film of the invention is, as shown in FIG. 5, a barrier-forming film A4 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3d of an inorganic oxide prepared by reforming the properties, as shown by the arrow P4, so that the degree of yellowing is improved to a range of from −0.3 to −2.0.

Figure 6:
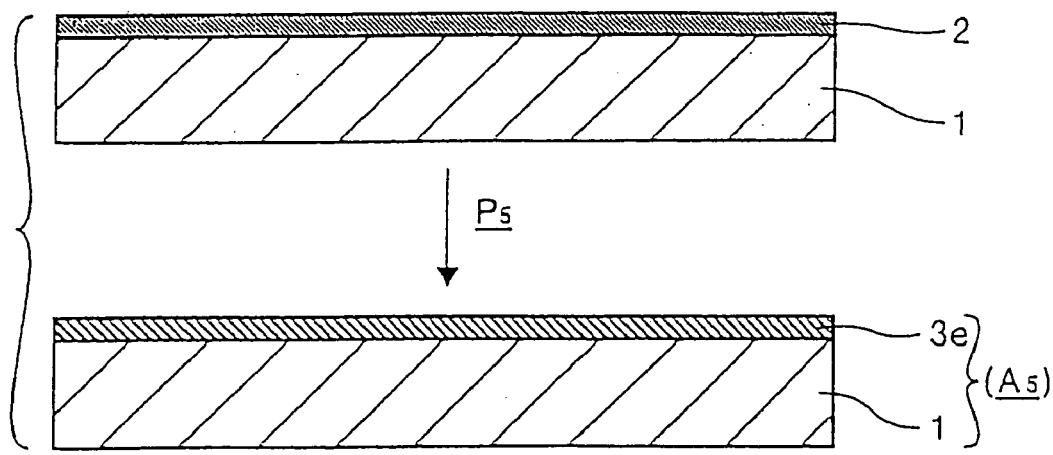
FIG. 6 is a schematic sectional view illustrating a typical layer configuration of the barrier-forming film of the invention.

Still another example of the barrier-forming film of the invention is, as shown in FIG. 6, a barrier-forming film A5 having a configuration in which a vapor-deposited film 2 of an in-organic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3e of an inorganic oxide prepared by reforming the properties, as shown by an arrow P5, so that the amount of change in X-value of the inorganic oxide expressed by a formula MOx composing the vapor-deposited film of the inorganic oxide (where, M represents a metal element, and the range of the value of X varies with the metal element) is increased to a range of from +0.01 to +0.50.

Figure 7:
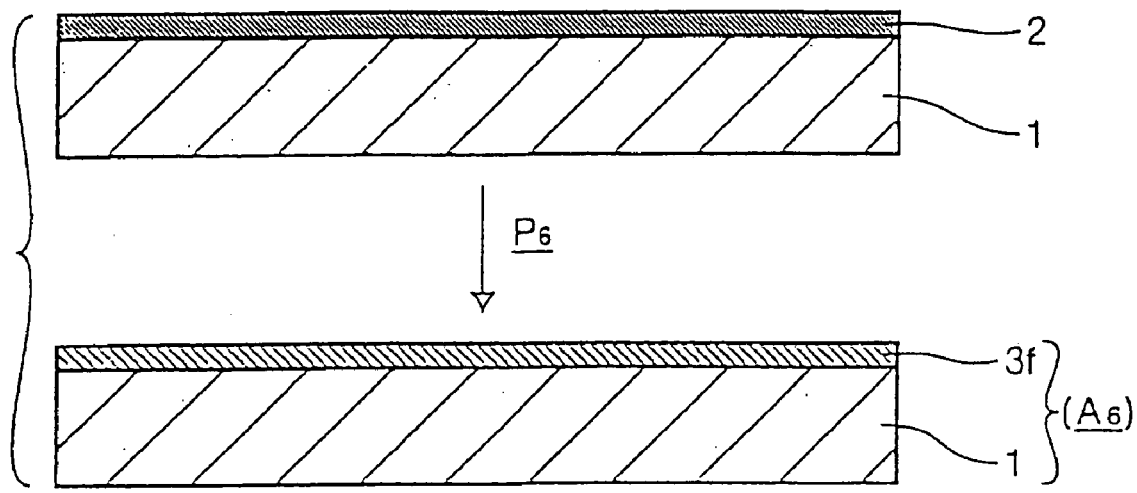
FIG. 7 is a schematic sectional view illustrating a typical layer configuration of the barrier-forming film of the invention.

Still another example of the barrier-forming film of the invention, as shown in FIG. 7, a barrier-forming film A6 having a configuration in which a vapor-deposited film 2 of an inorganic oxide such as silicon oxide or aluminum oxide is provided on one side of the substrate film 1,m and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3f of an inorganic oxide prepared by reforming the properties, as shown by an arrow P6, so that the surface roughness of the vapor-deposited film of the inorganic oxide is changed to a range of from 3 to 30 nm.

Figure 8:
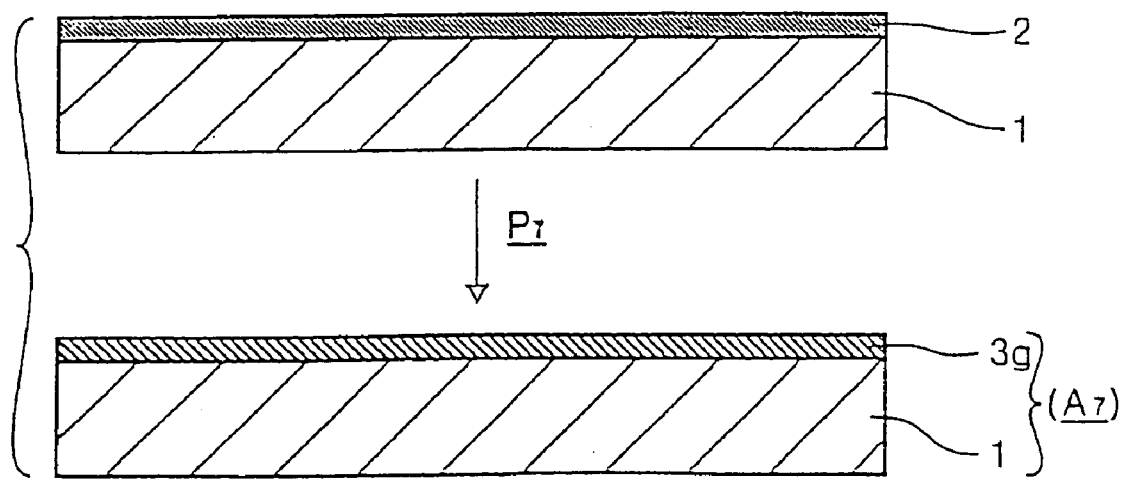
FIG. 8 is a schematic sectional view illustrating a typical layer configuration of the barrier-forming film of the invention.

Further another example of the barrier-forming film of the invention is, as shown in FIG. 8, a barrier-forming film A7 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3g of an inorganic oxide prepared by reforming the properties, as shown by an arrow P7, so that, as surface roughness of the vapor-deposited film of the inorganic oxide, the standard deviation of surface irregularities Rms-value is improved to a range of from 1.01 to 100 times as high.

The standard deviation of surface irregularities Rms-value will be described later.

Figure 9:
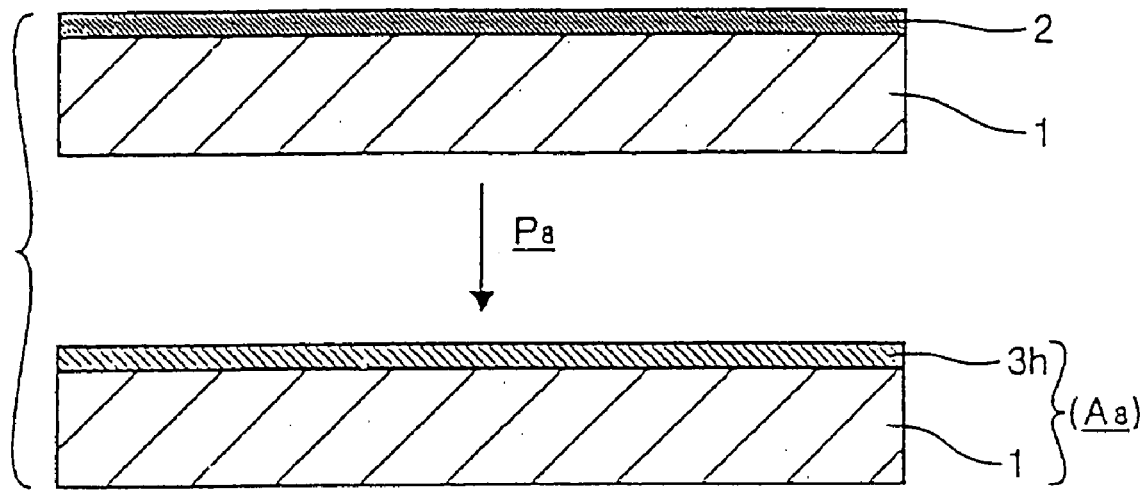
FIG. 9 is a schematic sectional view illustrating a typical layer configuration of the barrier-forming film of the invention.

Another example of the barrier-forming film of the invention is, as shown in FIG. 9, a barrier-forming film A8 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3h of an inorganic oxide prepared by reforming the properties, as shown by an arrow PP8, so that the substrate film is caused to shrink in at least one of the flow direction upon film forming and the width direction within a range of from −0.001 to −1.0%, and the density of the vapor-deposited film of the inorganic oxide is increased so as to bring the thickness of the vapor-deposited film of the inorganic oxide within a range of from 50 to 1,000 Å (5 to 100 nm).

In the above description, the thickness of the vapor-deposited film of the inorganic oxide is reduced to 0.01 to 10%, or more preferably, to 0.01 to 5% of the thickness thereof before annealing.

Figure 10:
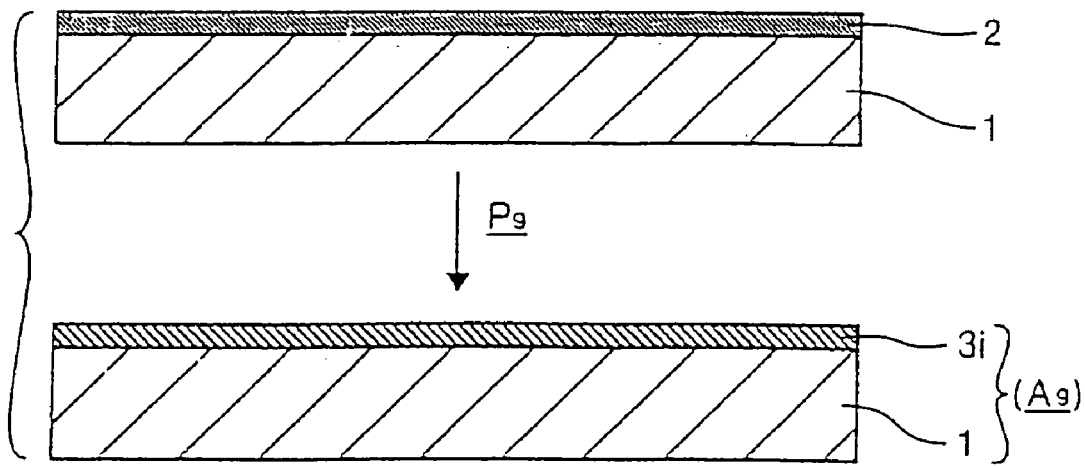
FIG. 10 is a schematic sectional view illustrating a typical layer configuration of the barrier-forming film of the invention.

Another example of the barrier-forming film of the invention is, as shown in FIG. 10, a barrier-forming film A9 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3i of an inorganic oxide prepared by reforming the properties, as shown by an arrow P9, so that the surface roughness of the vapor-deposited film of the inorganic oxide, as typically represented by a standard deviation of surface irregularities Rms-value, is improved to 1.01 to 100 times as high as that before the annealing treatment; the steam permeability thereof is within a range of from 2.0 to 0.000001 g/m².day; and the oxygen permeability is within a range of from 2.0 to 0.000001 cc/m².day.atm.

The standard deviation of surface irregularities Rms-value is defined as described above.

Figure 11:
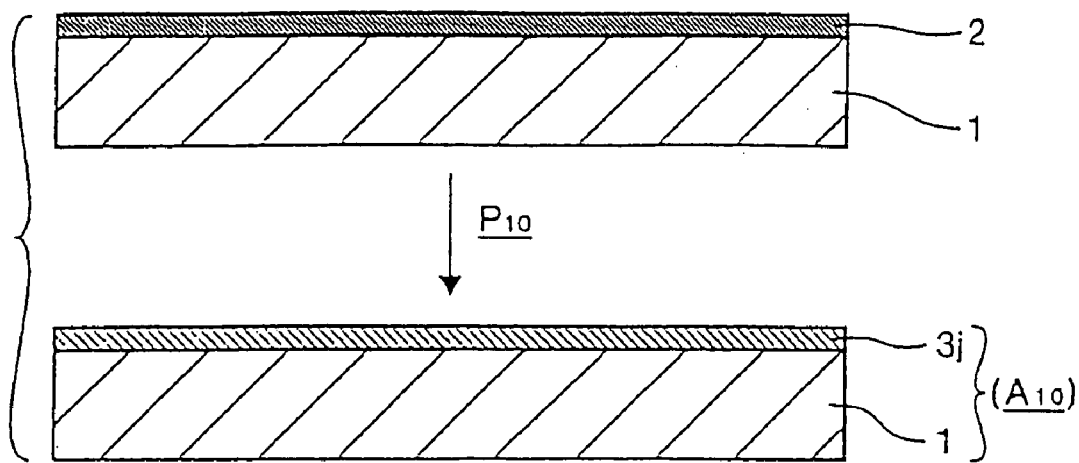
FIG. 11 is a schematic sectional view illustrating a typical layer configuration of the barrier-forming film of the invention.

Another example of the barrier-forming film of the invention is, as shown in FIG. 11, a barrier-forming film A10 having a configuration in which a vapor-deposited film 2 of an inorganic oxide such as silicon oxide or aluminum oxide is provided on one side of the substrate film 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3j of an inorganic oxide prepared by reforming the properties, as shown by an arrow P10, so that the substrate film is caused to shrink to a range of from −0.001 to −1.0% in at least one of the flow direction upon film forming and the width direction as compared with the shrinkage before the annealing treatment, and the density of the vapor-deposited film of the inorganic oxide is increased to bring the steam permeability to a range of from 2.0 to 0.000001 g/m$^2$.day and the oxygen permeability to a range of from 2.0 to 0.000001 cc/m$^2$.day.atm.

Figure 12:
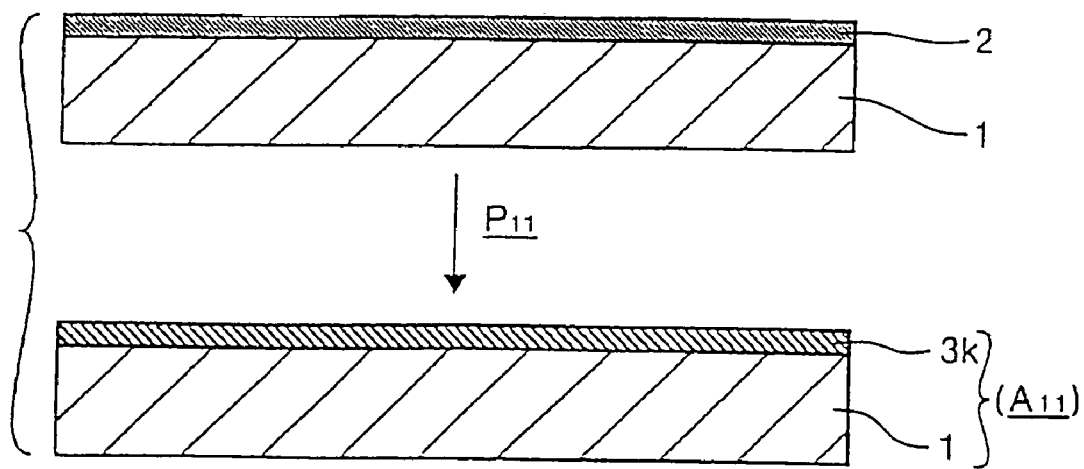
FIG. 12 is a schematic sectional view illustrating a typical layer configuration of the barrier-forming film of the invention.

Still another example of the barrier-forming film of the invention is, as shown in FIG. 12, a barrier-forming film A11 having a configuration in which a vapor-deposited film 2 of an inorganic oxide such as silicon oxide or aluminum oxide is provided on one side of the substrate 1, and the substrate film 1 having the vapor-deposited film 2 of the inorganic oxide is subjected to an annealing treatment comprising a heating treatment at a heating treatment temperature of at least room temperature for a heating treatment time of at least 30 minutes to form, on the above-mentioned vapor-deposited film 2 of silicon oxide, a vapor-deposited film 3k of an inorganic oxide prepared by reforming the properties, as shown by an arrow P11, so that the steam permeability thereof is within a range of from 2.0 to 0.000001 g/m$^2$.day and the oxygen permeability is within a range of from 2.0 to 0.000001 cc/m$^2$.day.atm; the degree of yellowing is improved to a range of from −0.3 to −2.0; the amount of change in X-value of the vapor-deposited film of the inorganic oxide as expressed by a formula MOx composing the vapor-deposited film of the inorganic oxide (where, M represents a metal element; the value of X varies with the metal element) is increased to a range of from +0.01 to +0.50; and the surface roughness of the vapor-deposited film of the inorganic oxide is changed within a range of from 3 to 30 nm.

The examples shown above are only some of the examples of the barrier-forming film of the invention, and the invention is never limited by these examples.

The present invention relates to a barrier-forming film having a basic structure in which a vapor-deposited film of an inorganic oxide such as silicon oxide or aluminum oxide is provided on one side of the substrate film, and the vapor-deposited film of the inorganic oxide such as silicon oxide or aluminum oxide is reformed by subjecting the substrate film having the vapor-deposited film of the inorganic oxide to an annealing treatment comprising a heating treatment at a heating treatment temperature of at least room temperature for a heating treatment of at least 30 minutes.

The material composing the barrier-forming film of the invention, and a manufacturing method thereof will now be described. The material for the substrate film composing the barrier-forming film of the invention should, because of the necessity to provide thereon a vapor-deposited film of an inorganic oxide such as silicon oxide or aluminum oxide, be a resin film or sheet excellent in mechanical, physical, chemical and other properties, should particularly be strong, tough and heat-resistant.

More specifically, applicable materials for the substrate film in the present invention include, for example, polyethylene resins, polypropylene resins, cyclic polyolefin resins, fluororesins, polystyrene resins, acrylonitrile-styrene copolymers (AS resins), acrylonitrile-butadiene-styrene copolymers (ABS resins), polyvinyl chloride resins, fluororesins, polymetacyl resins, polycarbonate resins, polyester resins such as polyethyleneterephthalate and polyethylenenaphthalate, polyamide resins such as various nylon materials, polyimide resins, polyamide-imide resins, polyacrylphthalate resins, silicone resins, polysulfon resins, polyphenylsulfide resins, polyethersulfon resins, polyurethane resins, acetal resins, cellulose resins, and various other resins, in the form of a film or a sheet.

In the present invention, it is particularly desirable to use a film or a sheet of a polypropylene resin, a polyester resin or a polyamide resin.

In the invention, available methods for manufacturing films or sheets of the aforementioned various resins include a method comprising the steps of using one or more kinds of the resins listed above and forming films by use of the extrusion method, the casting-forming method, the T-die method, the grinding method, and film forming methods, a method of forming a film by extruding a plurality of layer by use of two or more resins, and a method using two or more resins, mixing them, and then forming a film.

Then, for the purpose of improving heat resistance, strength, toughness, tensile strength, impact resistance, fracture resistance, and other mechanical, physical and chemical strength and resistance of the thus manufactured films or sheets of various resins, the tenter method or the tubular method is applied with simultaneous use of the uniaxial drawing method of drawing in a single direction or the biaxial drawing method of drawing the material in two directions to manufacture films or sheets of various resins.

In the drawing described above, the above-mentioned uniaxial drawing method may be conducted by use of the longitudinal uniaxial drawing method of drawing a film extruded from a T-die in the longitudinal direction between rolls, or by use of the lateral uniaxial drawing method of drawing the material in the lateral direction by means of a broadening machine known as a tenter.

Drawing can be accomplished by use of any of the following biaxial drawing methods. The tube method comprises the steps of further blowing air into a tubular film extruded from a ring-shaped die to expand the same, and at the same time, drawing the expanded film simultaneously in two directions longitudinally and laterally by stretching the material in the longitudinal direction. The simultaneous biaxial drawing method comprises the steps of solidifying a film extruded from a T-die through cooling rolls, heating the film to a drawing temperature (80 to 140° C.), holding the both edges of the heated film with clips of the tenter to draw the same in the lateral direction, and simultaneously longitudinally drawing the same by expanding the clip interval at a constant pitch. The longitudinal-lateral method comprises the steps of drawing longitudinally, and then laterally. The sequential biaxial drawing method comprises the steps of drawing the material laterally, and then drawing the same longitudinally.

For the films or sheets of the various resins drawn as above, size stability, thermal expansion coefficient, wet expansion coefficient, smoothness and other physical properties are improved. Varying with the kind of film or sheet of the resin, sa thermal stabilization treatment is applied through, for example, a heat treatment of heating the material at 70 to 150° C. for 1 to 76 hours to draw the same longitudinally to 2.5 to 6 times as large, and laterally to 2.5 to 10 times as large. Films or sheets of various resins having residual stress or residual strain within a range of from 0.1 to 1% are manufactured. In the invention, such a film or sheet of any of the various resins is used as a substrate film.

In the invention, the thickness of the film or sheet of any of the various resins should preferably be within a range of from about 6 to 100 μm, or more preferably, from 9 to 50 μm.

Residual stress of residual strain of the film or sheet of any of the various resins can be measured by a method specified in JIS: C2318 "Polyester Film for Electrical Uses" by use of a measuring instrument such as a Glass Scale DL-301 made by Ooyama Kogaku Co., Ltd.

In the invention, the shrinkage ratio of the substrate film in at least any one of the flow direction upon film forming and the width direction is kept within a range of from −0.001 to −1.0% and the density of the vapor-deposited film of an inorganic oxide is increased by providing the vapor-deposited film of the inorganic oxide on one side of the substrate film as described above, and subjecting the substrate film having the vapor-deposited film of the inorganic oxide to a heating treatment of an annealing treatment comprising a heating treatment, More specifically, in the present invention, as described later, residual stress or residual strain contained in the substrate film in an amount of up to 1%, or more in detail within a range of from 0.1 to 1% is corrected to a range of from about 0.01 to 0.999% by providing a vapor-deposited film of an inorganic oxide on one side of the substrate film, and subjecting the substrate film having the vapor-deposited film of the inorganic oxide to a heating treatment or an annealing treatment comprising a heating treatment. This causes the substrate film to shrink to a range of from −0.001 to −1.0% in at least any one of a single direction and two directions. At the same time, the vapor-deposited film of the inorganic oxide shrinks as well along with shrinkage of the substrate film. The density of particles themselves of the inorganic oxide composing the vapor-deposited film of the inorganic oxide is increased, thus remarkably increasing gas barrier-formability as represented by oxygen permeability or steam permeability.

Upon forming a film from one or more selected from the resins listed above, various plastic blending agents or additives may be added for the purpose of improving and reforming properties such as film workability, heat resistance, mechanical properties, size stability, oxidation resistance, slidability, strippability, hard flammability, mold resistance, electrical characteristics, strength and the like. The amount of addition thereof may be arbitrary within a range of from a trace to several tens % depending the purpose of use.

General additives applicable as above include, for example, a smoothing agent, a crosslinking agent, an oxidation preventive agent, an ultraviolet-rays absorbent, a light stabilizer, a filling agent, a smoothing agent, an anti-blocking agent, a dye, a coloring agent such as pigment and the like. Furthermore, a reforming resin may be used.

In the present invention, a desired surface-treated layer may be provided in advance as required on the surface of the film or sheet of any of the various resins for the purpose of improving adhesion to the vapor-deposited film of silicon oxide, as described later.

In the invention, the above-mentioned surface-treated layer may be provided in the form of, for example, a corona-treated layer, an ozone-treated layer, a plasma-treated layer, an oxidation-treated layer by applying as required a pretreatment such as a corona discharge treatment, an ozone treatment, a low-temperature plasma treatment using oxygen gas or nitrogen gas, a glow discharge treatment, and an oxidation treatment using a chemical.

The above-mentioned surface pretreatment is applied as a method for improving adhesion between the film or sheet of any of the various resins and the vapor-deposited film of silicon oxide. As a method for improving such adhesion, it is also possible to work out a surface-treated layer by arbitrarily forming previously a primer coating agent layer, an undercoat agent layer, an anchor coat layer, an adhesive layer or a vapor-deposited anchor coating agent layer on the surface of the film or sheet of any of the resins.

As the above-mentioned pretreatment coating agent layer, a resin composition containing as a main constituent of vehicle, for example, a polyester resin, a polyamide resin, a polyurethane resin, an epoxy resin, a phenol resin, a melamine resin, a (meta)acryl resin, a polyvinyl acetate resin, a polyolefin resin such as polyethylene or polypropylene or a copolymer or a modified resin thereof, a cellulose resin or the like.

The vapor-deposited film of an inorganic oxide such as silicon oxide or aluminum oxide forming the barrier-forming layer of the present invention will now be described. A vapor-deposited film of an inorganic oxide such as silicon oxide or aluminum oxide can be manufactured by forming a single-layer film of a vapor-deposited film of an inorganic oxide such as silicon oxide or aluminum oxide or a multi-layer film comprising two or more layers or a composite film by the chemical vapor deposition method, the physical vapor deposition method, or simultaneous use of these methods.

The vapor-deposited film of silicon oxide formed by the above-mentioned chemical vapor deposition method in the invention will now be described. A vapor-deposited of silicon oxide based on the chemical vapor deposition method can be formed by use of the chemical vapor deposition method such as the plasma chemical vapor deposition method, the thermo-chemical vapor deposition method, or the opto-chemical vapor deposition method.

More specifically, in the invention, a vapor-deposited film of silicon oxide can be formed on one side of the substrate film using a monomer gas for vapor deposition such as an organic silicon compound as the raw material, with an inert gas such as argon or helium gas as a carrier gas, and using oxygen gas as an oxygen feeding gas, by the application of the low-temperature plasma chemical vapor deposition method in a low-temperature plasma generator.

In the above process, a generator of high-frequency plasma, pulse wave plasma or microwave plasma may be used as the low-temperature plasma generator. In order to obtain high-activity stable plasma in the present invention, it is desirable to use a generator based on the high-frequency plasma method.

Figure 13:
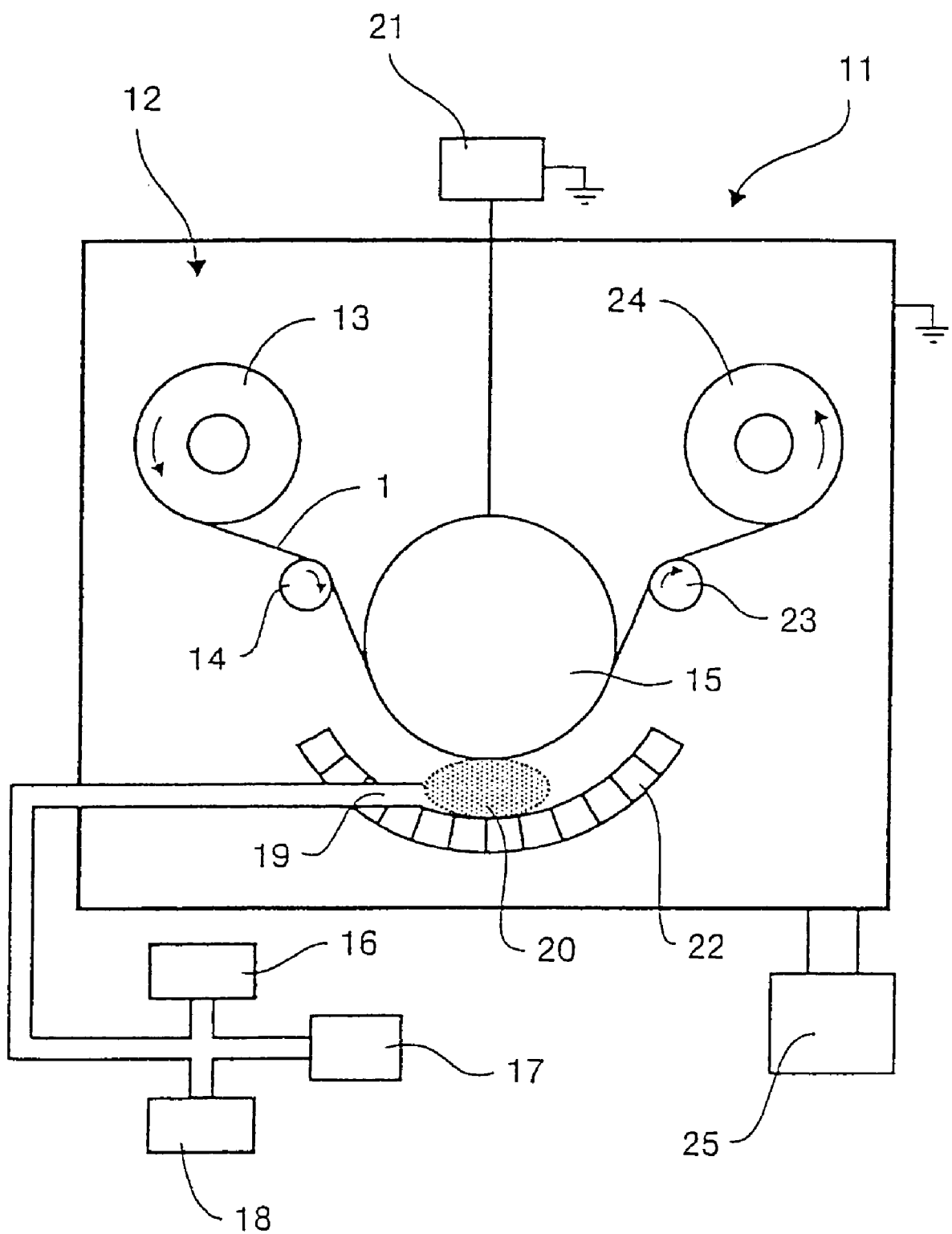
FIG. 13 is a schematic configuration diagram illustrating an outline of the plasma chemical vapor phase epitaxy device.

More specifically, an example of the forming method of the vapor-deposited film of silicon oxide by the above-mentioned low-temperature plasma chemical vapor deposition method will be described. FIG. 13 is a schematic configuration diagram of the low-temperature plasma chemical vapor deposition device, illustrating an outline of the forming method of the vapor-deposited film of silicon oxide based on the above-mentioned plasma chemical vapor deposition method.

In the present invention, as shown in FIG. 13, a substrate film 1 is delivered from a winding roll 13 arranged in a vacuum chamber 12 of a plasma chemical vapor deposition device 11, and the substrate film 11 is conveyed via an auxiliary roll 14 at a prescribed speed onto a peripheral surface of a cooling-electrode drum 15.

In the invention, a monomer gas for vapor deposition such as oxygen gas, an inert gas, an organic silicon compound and the like are supplied from a gas feeding devices 16 and 17 and a raw material vapor feeding device 18, and a mixed gas composition for vapor deposition is introduced into the vacuum chamber 12 via a raw material feeding nozzle 19 while adjusting the mixed gas composition for vapor deposition comprising the above gases. Plasma is produced by glow discharge plasma 20 on the substrate film 1 conveyed onto the peripheral surface of the above-mentioned cooling-electrode drum 15, and the vapor-deposited film of silicon oxide is formed by irradiating the thus produced plasma.

In the invention, at this point in time, prescribed power is applied to the cooling-electrode drum 15 from a power source 21 arranged outside the vacuum chamber 12. A magnet 22 is arranged near the cooling-electrode drum 15 to promote occurrence of plasma.

The vapor-deposited film of silicon oxide can be formed by the plasma chemical vapor deposition method in the invention by winding the substrate film 1 having the above-mentioned vapor-deposited film of silicon oxide formed thereon onto the winding roll 24 via the auxiliary roll 23. In the drawing, 25 represents a vacuum pump.

The above description only presents an example, and it is needless to mention that this does not limit the scope of the present invention.

In the invention, although not shown, the vapor-deposited film of an inorganic oxide is not limited to a single-layer one, but may also be a multi-layer film formed by laminating two or more layers. The materials may be of a single kind or two or more kinds in mixture. A vapor-deposited film of inorganic oxides may be used by mixing different kinds of materials.

In the above description, the degree of vacuum in the interior of the vacuum chamber 12 should preferably be adjusted to a range of from $1\times10^{-1}$ to $1\times10^{-8}$ Torr, or more preferably, from $1\times10^{-3}$ to $1\times10^{-7}$ Torr.

In the raw material evaporation supply device 18, a raw material organic silicon component is evaporated, mixed with oxygen gas or an inert gas fed from the gas feeders 16 and 17. The resultant mixed gas is introduced into the vacuum chamber 12 via a raw material feeding nozzle 19.

The content of the organic silicon compound in the mixed gas may be within a range of from about 1 to 40%. The content of oxygen gas may be within a range of from about 10 to 70%, and the content of inert gas, from about 10 to 60%, with a mixing ratio of the organic silicon compound, oxygen gas and the inert gas may be within a range of from 1:6:5 to 1:17:14.

On the other hand, because a prescribed voltage is impressed from the power source 21 onto the cooling-electrode drum 15, a glow discharge plasma 20 is generated near the opening of the raw material feeding nozzle 19 and the cooling-electrode drum 15 in the vacuum chamber 12. The glow discharge plasma 20 is derived from one or more constituents of the mixed gas. In this state, the substrate film 1 is conveyed at a certain speed, and a vapor-deposited film of silicon oxide can be formed on the substrate film 1 on the peripheral surface of the cooling-electrode drum 15 by the glow discharge plasma 20.

The degree of vacuum in the interior of the vacuum chamber at this moment should preferably be adjusted within a range of from about $1\times10^{-1}$ to $1\times10^{-4}$ Torr, or more preferably, from $1\times10^{-1}$ to $1\times10^{-2}$ Torr. The conveying speed of the substrate film 1 should preferably be adjusted within a range of from about 10 to 300 m/minute, or more preferably, from 50 to 150 m/minute.

In the above-mentioned plasma chemical vapor deposition device 11, the vapor-deposited film of silicon oxide is formed into a thin film SiOx while oxidizing the plasma raw material gas with oxygen gas onto the substrate film 1. The resultant vapor-deposited film of silicon oxide comprises therefore continuous layers which are dense, having only a few pores, and are rich in flexibility. As a result, the vapor-deposited film of silicon oxide has a far higher barrier-formability than that of a conventional vapor-deposited film of silicon oxide formed by the vacuum vapor deposition method, and a thin thickness can provide a sufficient barrier-formability.

The present invention provides advantages in that, because the plasma cleans the surface of the substrate 1, producing polar groups or free radicals on the substrate film 1 surface, adhesion between the formed vapor-deposited film of silicon oxide and the substrate film 1 is high.

The degree of vacuum upon forming the vapor-deposited film of silicon oxide is adjusted to a range of from about $1\times10^{-1}$ to $1\times10^{-4}$ Torr, or more preferably, from $1\times10^{-1}$ to $1\times10^{-2}$ Torr. Since this is a degree of vacuum lower than the degree of vacuum upon forming a vapor-deposited film of silicon oxide by the conventional vacuum deposition method of $1\times10^{-4}$ to $1\times10^{-5}$, it is possible to reduce the vacuum state setting time upon replacing the substrate film 1, permit easy stabilization of the degree of vacuum, thus stabilizing the film forming process.

In the formation of the vapor-deposited film of silicon oxide by use of a vapor-depositing monomer gas such as organic silicon compound, the vapor-depositing monomer gas such as organic silicon compound reacts with oxygen gas or the like. Reaction products adhere to one side of the substrate film, and form a dense thin film high in flexibility. The resultant thin film is continuous and mainly comprises silicon oxide usually expressed by a general formula SiOx (where, X represents a number of 0 to 2).

The above-mentioned vapor-deposited film of silicon oxide should preferably be a thin film mainly comprising silicon oxide expressed by the general formula SiOx (where, X represents a number within a range of from 1.3 to 1.9) from the point of view of transparency and barrier-formability.

The value of X in the above-mentioned formula depends upon a molar ratio of the vapor-depositing monomer gas and plasma energy. In general, a smaller value of X leads to a lower gas permeability, but to a yellowish color of the film itself and a poorer transparency.

The above-mentioned vapor-deposited film of silicon oxide mainly comprises silicon oxide, and additionally contains, through chemical coupling, at least a compound comprising one or more elements selected from the group consisting of carbon, hydrogen, silicon and oxygen.

Applicable cases include a compound having a C—H coupling, a compound having an Si—H coupling, a graphite-shaped, diamond-shaped or fullerene-shaped carbon units, and a raw material chemical coupling of organic silicon compounds and derivatives thereof.

More specifically, they include hydrocarbon having a $CH_3$ site, a hydro-silicon such as $SiH_3$ silyl or $SiH_2$ silyl, and a hydroxide derivatives such as $SiH_2OH$ silanol.

It is possible to change the kind and amount of compounds contained in the vapor-deposited film of silicon oxide by varying conditions of vapor depositing process, apart from the above.

The content of the above-mentioned compound in the vapor-deposited film of silicon oxide should preferably be within a range of from 0.1 to 50%, or more preferably, from 5 to 20%.

With a content of under 0.1%, the vapor-deposited film of silicon oxide is poor in impact resistance, spreadability and flexibility. Bending may easily cause scratches and cracks and this makes it difficult to stably maintain a high barrier-formability. A content of over 50% is not desirable because there is a decrease in barrier-formability.

In the vapor-deposited film of silicon oxide of the invention, the content of the above-mentioned compound should preferably be lower from the surface of the vapor-deposited film of silicon oxide toward the depth. This improves impact resistance under the effect of the compound on the surface of the vapor-deposited silicon oxide film. On the interface with the resin film, on the other hand, a small content of the above-mentioned compound provides an advantage of a stronger adhesion between the substrate film and the vapor-deposited silicon oxide film.

In the invention, the aforementioned physical properties can be confirmed through elementary analysis of the vapor-deposited silicon oxide film by use of an analyzing method of performing ion etching in the depth direction on a surface analyzer such as an X-ray photoelectric spectroscopy (XPS), or a secondary ion mass-spectroscopy (SIMS).

In the invention, the thickness of the above-mentioned vapor-deposited silicon oxide film should preferably be within a range of from about 50 to 4,000 Å, or more preferably, from about 50 to 1,000 Å. In the above description, a thickness of over 1,000 Å or over 4,000 Å is not desirable because of easy occurrence of cracks in the film, and a thickness of under 50 Å is not acceptable because of difficulty to achieve advantages of barrier-formability.

In this respect, the film thickness can be measured by the fundamental parameter method by use, for example, of a fluorescent X-ray analyzer made by Rigaku Co., Ltd. (Model RIX 2000).

In the above description, applicable means for changing thickness of the above-mentioned vapor-deposited silicon oxide film include methods of increasing the volume velocity of the vapor-deposited film such as a method of increasing the amount of the monomer gas and oxygen gas, and a method of reducing the vapor-depositing rate.

Applicable monomer gases for vapor deposition of organic silicon compounds forming the vapor-deposited silicon oxide film include, for example, 1,1,3,3-tetramethyldisiloxane, hexamethyldisiloxane, vinyltrimethylsilance, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methylethoxysilane, actamethylcyclo-tetrasiloxane and the like.

In the invention, among others, it is particularly preferable to use 1,1,3,3-tetramethyldisiloxane or hexamethyldisiloxane as a raw material from the point of view of handling convenience and properties of the formed continuous film.

For example, argon gas or helium gas may be used as an inert gas in the above description.

The vapor-deposited film of an inorganic oxide such as silicon oxide or aluminum oxide based on the above-mentioned physical vapor deposition (PVD) method in the invention will now be described further in detail. Such a vapor-deposited film of an inorganic oxide such as silicon oxide or aluminum oxide based on the physical vapor-deposition method may be formed by a physical vapor deposition method such as the vacuum vapor deposition method, the sputtering method, the ion plating method or the ion cluster beam method.

More specifically, in the present invention, an amorphous thin film of an inorganic oxide can be formed by the vacuum vapor deposition method using a metal oxide as a raw material and vapor-depositing the same onto the substrate film; the oxidizing reaction vapor deposition method using a metal or a metal oxide as a raw material, introducing oxygen and vapor-depositing the same onto the substrate film; or the plasma-assisted oxidizing reaction vapor deposition method assisting the oxidizing reaction by means of plasma.

In the above-description, the material for vapor deposition can be heated, for example, by resistance heating, high-frequency induction heating, or electron beam heating (E.B.).

Any vapor-deposited film of an inorganic oxide may be basically used so far as it is a thin film onto which a metal oxide is vapor-deposited. Oxides of a metal such as silicon (Si), aluminum (Al), magnesium (Mg), calcium (Ca), potassium (K), tin (Sn), sodium (Na), boron (B), titanium (Ti), lead (Pb), zirconium (Zr), or yttrium (Y) may be used.

Preferable metal oxides include oxides of silicon (Si) and aluminum (Al).

The above-mentioned vapor-deposited films of a metal oxide may be called in terms of metal oxides such as silicon oxide, aluminum oxide, and magnesium oxide, and can be denoted in the form of MOx (where, M represents a metal element; and the range of the value of X varies with the metal element) such as $SiO_x$, $AlO_x$ and $MgO_x$.

The range of the value of X is from 0 to 2 for silicon (Si), from 0 to 1.5 for aluminum (Al), from 0 to 1 for magnesium (Mg), from 0 to 1 for calcium (Ca), from 0 to 0.5 for potassium (K), from 0 to 2 for tin (Sn), from 0 to 0.5 for sodium (Na), from 0 to 1.5 for boron (B), from 0 to 2 for titanium (Ti), from 0 to 1 for lead (Pb), from 0 to 2 for zirconium (Zr), and 0 to 1.5 for yttrium (Y).

In the above description, X=0 represents a perfect metal which is unusable at all, not being transparent. The upper limit value of X range represents complete oxidation.

In the invention, in general, elements other than silicon (Si) and aluminum (Al) are used practically almost in no case. Silicon (Si) within a range of from 1.0 to 2.0 and aluminum (Al) within a range of from 0.5 to 1.5 are applicable.

The thickness of the vapor-deposited film of an inorganic oxide as described above in the present invention, varying with the kind of metal oxide or the like, should be selected within a range of from about 50 to 4,000 Å, preferably from about 50 to 1,000 Å.

In the invention, a vapor-deposited film of a mixture of different materials can be formed by using a metal or a metal oxides of a kind or two or more kinds in mixture.

Figure 14:
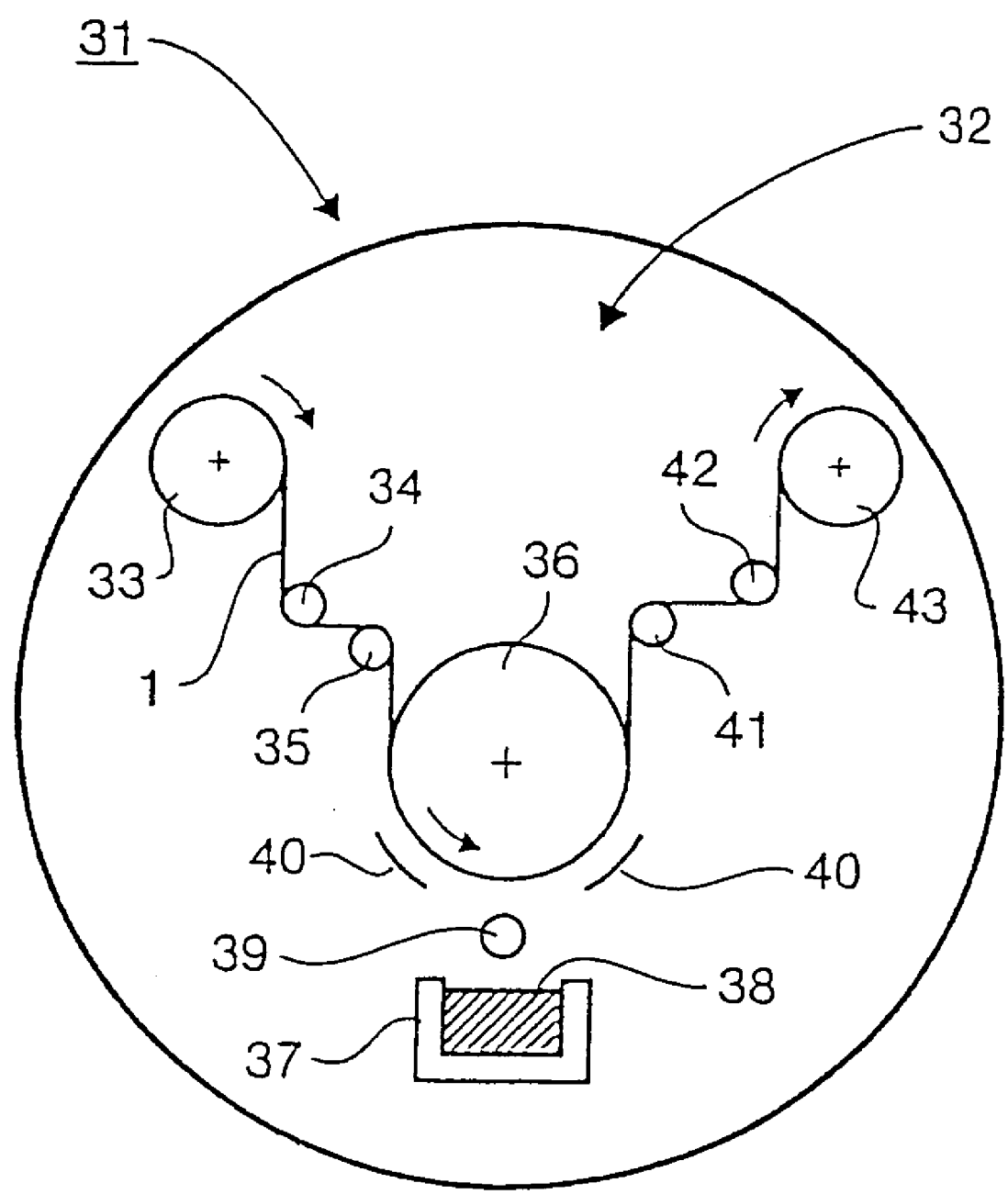
FIG. 14 is a schematic configuration diagram illustrating an outline of the winding vacuum deposition device.

A concrete example of the method for forming the above-mentioned vapor-deposited film of an inorganic oxide in the invention will now be described. FIG. 14 is a schematic configuration diagram illustrating a typical winding type vacuum vapor deposition device.

As shown in FIG. 14, the substrate film 1 delivered from the delivery roll 33 in the vacuum chamber 32 of the winding vacuum vapor deposition device 31 is guided to a cooled coating drum 36 via guide rolls 34 and 35.

A vapor deposition source 39 such as metal aluminum or aluminum oxide, heated in a crucible 37, is evaporated onto the substrate film 1 guided onto the above-mentioned coating drum 36, and furthermore as required, oxygen gas or the like is ejected from an oxygen gas blowing port 39. A vapor-deposited film of an inorganic oxide such as aluminum oxide is formed via masks 40 and 40 while feeding the same.

Then, in the invention, a resin film 1 having a vapor-deposited film of an inorganic film of the invention can thus be manufactured by winding the substrate film 1 having a vapor-deposited film of an inorganic oxide such as aluminum oxide onto a winding roll 43 via the guide rolls 41 and 42.

The case presented above is only an example, and it is needless to mention that the present invention is not limited by such an example.

In the present invention, it is possible to form a vapor-deposited film of an inorganic oxide comprising a multilayer film having two or more layers by using a winding type vacuum vapor deposition device as described above, forming a vapor-deposited film of an inorganic oxide serving as a first layer, then similarly, forming another vapor-deposited film of an inorganic oxide on the thus formed vapor-deposited film of the inorganic oxide, or connecting the two layer in a continuous form by use of the winding type vacuum vapor deposition device as described above, and continuously forming vapor-deposited film(s) of the inorganic oxide.

The heating treatment process of heating-treating the substrate film having the vapor-deposited film of an inorganic oxide such as silicon oxide or aluminum oxide formed thereon at a heating treatment temperature of t least room temperature for a heating treatment time of at least 30 minutes will now be described. The heating treatment method comprises, for example, the steps of providing a temperature-adjustable room, and holding substrate films each having a vapor-deposited film of an inorganic oxide such as silicon oxide or aluminum oxide formed thereon in this room in which the heating treatment is adjusted to a prescribed temperature of at least room temperature, and a piled state sheet by sheet, or in a state wound on a roll, or holding substrate films each having a vapor-deposited film of an inorganic oxide such as silicon oxide or aluminum oxide in a thermostat containing an air circulation system such as a rotary fan to efficiently adjust temperature in a temperature adjustable drying space, in a piled state sheet by sheet, or in a state wound on a roll, thereby applying a heating treatment. The heating treatment may be carried out by any other method.

The heating treatment temperature in the process described above will further be described. In the present invention, the heating treatment temperature, depending upon the heating treatment time, should preferably be within a range of, for example, from room temperature to about 200° C., or more preferably, from about 55 to 150° C.

The heating treatment time in the process described above will further be described. In the present invention, the heating treatment time, depending upon the heating treatment temperature, should preferably be within a range of, for example, from about 30 minutes to five days, or more preferably, from about 12 hours to three days.

In the invention, more specifically, the heat treatment temperature and the heat treatment time should preferably be within a range of from about 55 to 150° C., and within a range of from about 12 to 36 hours, respectively.

In the invention, the heating treatment may be carried out by a method of setting a heating treatment temperature at about 55° C. and conducting the heating treatment for a heating treatment time of about 24 hours, a method of setting a heat treatment temperature at about 70° C. and conducting the heating treatment for a heat treatment time of about 24 hours, or a method of setting a heat treatment temperature at about 90° C. and conducting the heating treatment for a heating treatment for a heating treatment time of about 24 hours.

In the heating treatment described above, it is not necessary to adjust pressure, humidity and other conditions.

In the present invention, the heating treatment as described above corresponds to an annealing treatment comprising the steps of heating the substrate film to a certain temperature, holding the same at this temperature for a while, and cooling the same to room temperature.

Figure 15:
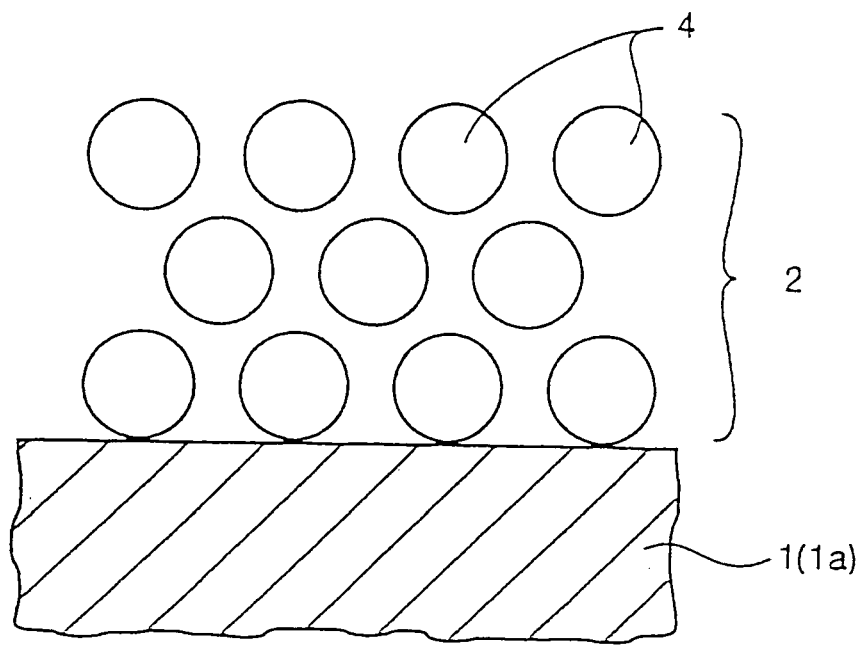
FIG. 15 is a schematic sectional view illustrating a typical layer configuration of the barrier-forming film of the invention.

More specifically, in the invention, as shown schematically in FIG. 15, a film or sheet 1a of any of various resins prepared by subjecting to a uniaxial or biaxial drawing, and further subjecting to a thermal stabilization treatment such as a heat treatment, and having a residual stress or residual strain of up to 1%, or more particularly, within a range of from 0.1 to 1% is set as the substrate film 1 having the vapor-deposited film of an inorganic oxide such as silicon oxide or aluminum oxide.

In the present invention, using, for example, silicon oxide, metal aluminum or aluminum oxide as a vapor-deposition source, the same is evaporated by heating, and particles 4 of an inorganic oxide such as silicon oxide or aluminum oxide are piled up while feeding oxygen gas as required, thereby forming the vapor-deposited film 2 of the accumulated inorganic oxide.

Figure 16:
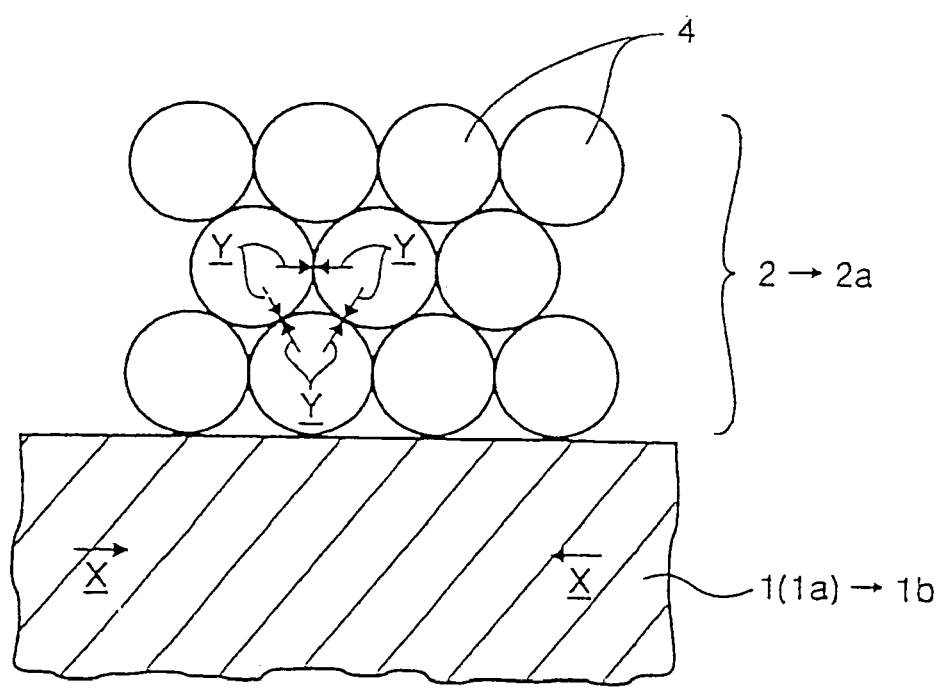
FIG. 16 is a schematic sectional view illustrating a typical layer configuration of the barrier-forming film of the invention.

In the present invention, as shown in FIG. 16, a heating treatment or an annealing treatment comprising a heating treatment is applied to the substrate film 1 (1a) having the vapor-deposited film 2 on which the particles 4 of the inorganic oxide such as silicon oxide or aluminum oxide are piled up and accumulated as described above. As a result, the substrate film 1 (1a) itself or the surface thereof thermally shrinks. The vapor-deposited film of the inorganic oxide is made denser along with shrinkage of the substrate film in at least one of the flow direction upon forming the film and the width direction by $-0.001$ to $-1.0\%$.

More particularly, in the invention, the vapor-deposited film of the inorganic oxide is provided on one side of the substrate film as described above, and the substrate film having the vapor-deposited film of the inorganic oxide formed thereon is subjected to a heating treatment or an annealing treatment comprising a heating treatment to remove residual stress or residual strain contained in the substrate film 1 (1a) in an amount of 1%, or more specifically, within a range of from 0.1 to 1% to correct the residual stress or residual strain to a range of from about 0.01 to 0.99%. The substrate film is caused to shrink in a direction or at least any one of two directions by $-0.001$ to $-1.0\%$ to ensure size stability, eliminate defects and form a substrate film 1b having improved physical properties. Along with this, the vapor-deposited film 2 of the inorganic oxide formed by piling and accumulation of particles 4 of the inorganic oxide such as silicon oxide or aluminum oxide provided thereon also shrinks. As a result, as shown by an arrow Y, the particles 4 of the inorganic oxide such as silicon oxide or aluminum oxide forming the vapor-deposited film 2 of the inorganic oxide become closer to each other, closing pores, filling such pores, thereby forming a vapor-deposited film 2a of the inorganic oxide comprising a dense and continuous thin film. It is thus possible to form a vapor-deposited film of the inorganic oxide (vapor-deposited film of the inorganic oxide shown by 3 to 3k in the drawing) having improved properties such as steam permeability, oxygen permeability, degree of yellowing of color tone, the amount of change in X-value of the inorganic oxide as expressed by a formula MOx forming the vapor-deposited film of inorganic oxide (where, M represents a metal element; and the range of value of X varies with the metal element), surface roughness of the vapor-deposited film of inorganic oxide, and the like.

The above-mentioned elimination of residual stress or residual strain contained in the substrate film 1 in an amount of up to 1%, or more specifically, within a range of from 0.1 to 1% and correction thereof to a range of from 0.01 to 0.99% corresponds to correction of residual stress or residual strain contained in the substrate film in an amount of up to 1%, or more specifically, within a range of from 0.1 to 1% at a ratio of about 0.01 to 95%.

In the present invention, a heating treatment temperature of under room temperature beings about no change in the film quality of the vapor-deposited film of an inorganic oxide such as silicon oxide or aluminum oxide in the substrate film having the vapor-deposited film of the inorganic oxide such as silicon oxide or aluminum oxide, and is not desirable because achievement of advantages is not observed. A heating treatment temperature of over 200° C., or even over 150° C. is not desirable because the substrate film melts and cannot maintain the shape thereof, and moreover, becomes poorer in productivity.

In the invention, a heating treatment time as described above of under 30 minutes provides no change in film quality of the vapor-deposited film of an inorganic oxide such as silicon oxide or aluminum oxide in the substrate film having the vapor-deposited film of the inorganic oxide such as silicon oxide or aluminum oxide, and is not desirable because achievement of advantages is not observed. A heating treatment time of over five days, or ben over three days is not desirable since there is available only a poorer productivity.

As is clear from the above description, in the invention, a vapor-deposited film of an inorganic oxide such as silicon oxide or aluminum oxide is provided on one side of the substrate film, and the substrate film having the vapor-deposited film of the inorganic oxide such as silicon oxide or aluminum oxide is subjected to an annealing treatment comprising a heating treatment at a heat treatment temperature of at least room temperature for a heating treatment time of at least 30 minutes. As a result, the properties of the vapor-deposited film of the inorganic oxide such as silicon oxide or aluminum oxide provided on the substrate film are improved, and it is possible to form a vapor-deposited film of the inorganic oxide such as silicon oxide having improved properties including steam permeability, oxygen permeability, degree of yellowing of color tone, amount of change in X-value of silicon oxide as expressed by a formula SiO2 composing the vapor-deposited film, surface roughness of a vapor-deposited film, shrinkage of the substrate film, thickness of the vapor-deposited film of the inorganic oxide and other properties.

In the present invention, as a barrier-forming material for forming a packaging container or the like, it is desirable to manufacture a barrier-forming film having a configuration in which a vapor-deposited film of an inorganic oxide such as silicon oxide or aluminum oxide is provided on one side of a substrate film; and the substrate film having the vapor-deposited film of the inorganic oxide such as silicon oxide or aluminum oxide formed thereon is subjected to a heating treatment at a heating treatment temperature of at least room temperature for a heating treatment time of at least 30 minutes to improve the film quality of the vapor-deposited film of the inorganic oxide such as silicon oxide or aluminum oxide provided on the substrate film to bring the steam permeability thereof within a range of from 2.0 to 0.000001 $g/m^2$.day and the oxygen permeability within a range of from 2.0 to 0.000001 $cc/m^2$.day.atm, to improve the degree of yellowing to a range of from −0.3 to −2.0, to increase the amount of change in X-value of the inorganic oxide as expressed by a general formula Mx composing the vapor-deposited film of the inorganic oxide (where, M represents a metal element, and the range of value of X varies with the metal element) to a range of from +0.01 to +0.50, and to adjust the surface roughness of the vapor-deposited film of the inorganic oxide to a range of from 3 to 30.

In the present invention, a vapor-deposited film of an inorganic oxide such as silicon oxide or aluminum oxide is provided on one side of the substrate film, and the substrate film having the vapor-deposited film of the inorganic oxide such as silicon oxide or aluminum oxide formed thereof is subjected to an annealing treatment comprising a heating treatment at a heating treatment temperature of at least room temperature for a heating treatment time of at least 30 minutes to cause the substrate film to shrink after the annealing treatment in at least any one of the flow direction upon film forming and the width direction within a range of from −0.001 to −1.0%, wherein the thickness of the vapor-deposited film of the inorganic oxide is within a range of from 50 to 1,000 Å (5 to 100 nm).

In the present invention, furthermore, after the annealing treatment as described above, the substrate film having the vapor-deposited film of the inorganic oxide such as silicon oxide or aluminum oxide has, as compared with before the annealing treatment, an improvement ratio of steam permeability [improvement ratio=(after treatment÷before treatment)] within a range of from 1/100 to 99/100, and an improvement ratio of oxygen permeability [improvement ratio=(after treatment÷before treatment)] within a range of from 1/100 to 99/100; and the amount of decrease in steam permeability is within a range of from −0.1 to −30 $g/m^2$.day and the amount of decrease in oxygen permeability is within a range of from −0.1 to −10 $cc/m^2$.day.atm.

In the present invention, in the substrate film having the vapor-deposited film of the inorganic oxide such as silicon oxide or aluminum oxide, after the annealing treatment, the surface roughness of the vapor-deposited film of the inorganic oxide, as typically represented by the standard deviation of surface irregularities Rms-value is improved to 1.01 to 100 times as high as before the annealing treatment.

The above-mentioned standard deviation of surface irregularities Rms-value is as described later.

In the present invention, it is possible to manufacture a barrier-forming film having a configuration in which a vapor-deposited film of an inorganic oxide such as silicon oxide or aluminum oxide is provided on one side of the substrate film, and the substrate film having the vapor-deposited film of the inorganic oxide is subjected to an annealing treatment comprising a heating treatment at a heating treatment temperature of at least room temperature for a heating treatment time of at least 30 minutes to improve, as compared with before the annealing treatment, the surface roughness of the vapor-deposited film of the inorganic oxide as typically represented by the standard deviation of surface irregularities Rms-value to 1.01 to 100 times as high, and to bring the steam permeability thereof to a range of from 2.0 to 0.000001 $g/m^2$.day, and the oxygen permeability to a range of from 2.0 to 0.000001 $cc/m^2$.day.atm, thereby reforming the properties of the vapor-deposited film of the inorganic oxide.

In the present invention, it is possible to manufacture a barrier-forming film having a configuration in which a vapor-deposited film of an inorganic oxide such as silicon oxide or aluminum oxide is provided on one side of the substrate film, and the substrate film having the vapor-deposited film of the inorganic oxide is subjected to an annealing treatment comprising a heating treatment at a heating treatment temperature of at least room temperature for a heating treatment time of at least 30 minutes to cause, as compared with before the annealing treatment, the above-mentioned vapor-deposited film of silicon oxide to shrink in at least any one of the flow direction upon film forming and the width direction to a range of from −0.001 to −1.0%, and to bring the steam permeability thereof to a range of from 2.0 to 0.000001 $g/m^2.day$, and the oxygen permeability to a range of from 2.0 to 0.000001 $cc/m^2.day.atm$, thereby reforming the properties of the vapor-deposited film of the inorganic oxide.

In the present invention, the quality of the vapor-deposited film of an inorganic oxide such as silicon oxide or aluminum oxide provided on the substrate film is changed and reformed through the heating treatment or the annealing treatment comprising a heating treatment. Although the reason of this change and reform is not as yet known, the vapor-deposited film of the inorganic oxide such as silicon oxide or aluminum oxide vapor-deposited onto one side of the substrate film results from formation of a vapor-deposited film of the inorganic oxide such as silicon oxide or aluminum oxide, as described above, the piled and accumulated particles of vapor of silicon oxide or aluminum oxide. Numerous fine pores are formed in the vapor-deposited film of the inorganic oxide such as silicon oxide or aluminum oxide. Upon shrinkage of the substrate film itself or the surface layer thereof as a result of the heating treatment or the annealing treatment comprising the heating treatment, in cooperation with the vapor-deposited film of the inorganic oxide such as silicon oxide or aluminum oxide, the particles of silicon oxide or aluminum oxide forming the vapor-deposited film of the inorganic oxide are considered to become denser, close these pores, thus forming a dense and continuous thin film.

The barrier-forming film of the present invention manufactured as described above is applicable to manufacture of laminated members of various forms by using the same as a barrier-forming material and laminating with one or two of substrate such as a plastic film, a paper substrate, metal foil or a metal sheet, cellophane, woven cloth or non-woven cloth, a glass sheet or the like, and the manufactured laminated members are applicable to various uses including a packaging material, an optical member, a protective sheet for a solar cell module, a protective film for an organic EL display, a protective film for a film liquid crystal display, a packaging material for a polymer battery and an aluminum packaging material.

As an example of the manufacturing method of the above-mentioned laminated member, it is possible to manufacture a laminated member comprising various forms by forming a primer agent layer on the surface of the vapor-deposited film of an inorganic oxide such as silicon oxide or aluminum oxide of the above-mentioned barrier-forming film of the invention, then, forming an adhesive layer for lamination on the surface of the primer agent layer, and then, laminating substances such as plastic films by the dry lamination method via the primer agent layer and the adhesive layer for lamination.

In the present invention, it is also possible to manufacture laminated members of various forms by, for example, forming a primer agent layer on the surface of the vapor-deposited film of the inorganic oxide such as silicon oxide or aluminum oxide of the barrier-forming film of the invention, then, forming an anchor coating agent layer on the surface of the primer agent layer, and then, laminating desired substrates through melting extrusion of various resins via the primer agent layer and the anchor coating agent layer by the application of the extrusion laminating method.

In the present invention, it is possible to manufacture laminated members of various forms by arbitrarily laminating other desired substrates as above on the substrate film composing the barrier-forming film of the invention. In the invention, it is possible to design and manufacture laminated members of various forms by arbitrarily laminating other substrates in response to the purpose of use, the form of use, usage and the like.

A packaging container will now be described as an example of use of the above-mentioned laminated member in the present invention. In the present invention, it is possible to manufacture a three-side sealing type soft packaging container by providing two laminated materials described above, piling them up with heat-sealing resin layer surfaces serving as the innermost layers so as to face each other, then, forming a heat-sealed portion by heat-sealing three sides of out peripheral edge, and providing an opening at the top.

In the invention, although not shown, it is possible to manufacture packaging members of various forms by filling the thus manufactured three-side sealed type soft packaging container with an eatable or drinkable through the opening thereof, then, forming a top sealed portion by heat-sealing the top opening, and then, as required, applying a boiling treatment or a retort treatment.

It is needless to mention that the present invention is not limited to the above-mentioned packaging container, and it is possible to manufacture packaging containers of various forms including soft packaging bags, liquid paper containers and paper cans, depending upon the purpose of use and usage.

The primer agent layer, a component of the above-mentioned laminated member in the present invention will now be described. The primer agent layer can be formed by using a polyurethane resin or a polyester resin as a main constituent of vehicle, adding from 0.05 to 10 wt. %, or preferably, from 0.1 to 5 wt. % silane coupling agent and from 0.1 to 20 wt. %, or preferably, from 1 to 10 wt. % filling agent relative to from 1 to 30 wt. % polyurethane resin or polyester resin, further adding, as required, arbitrarily a stabilizer, a hardening agent, a crosslinking agent, a smoothing agent, an ultraviolet-ray absorbent or other additives, adjusting the polyurethane resin or polyester resin composition by adding a solvent and a diluent and mixing sufficiently, coating this polyurethane or polyester composition onto the vapor-deposited film of the inorganic oxide such as silicon oxide or aluminum oxide by roll coating, gravure coating, knife coating, dip coating, spray coating or any other coating method, then removing the solvent and the diluent by drying the coating film, and as required, conducting an aging treatment.

In the invention, the primer agent layer should preferably has a thickness within a range of, for example, from 0.1 to 1.0 $g/m^2$ (in dry).

In the present invention, the above-mentioned primer agent layer serves to improve adhesion between the vapor-deposited film of the inorganic oxide such as silicon oxide or aluminum oxide and the heat-sealed resin layer, and at the same time, drawing of the primer agent layer, for example, the post-working adaptability such as bag working, thus preventing occurrence of cracks in the vapor-deposited film of the inorganic oxide such as silicon oxide or aluminum oxide during post-working.

In the above description, a polyurethane resin available, for example, from reaction between a polyfunctional isocyanate and a compound containing a hydroxyl group can be used as a polyurethane resin composing the polyurethane resin composition.

More specifically, it is possible to use a single-fluid or double-fluid hardening type polyurethane resin available from a reaction between an aromatic polyisocyanate such as tolylene-diisocyanate, diphenylmethanediisocyanate or polyethylenepoly-phenylenepolyisocyanate, or polyfunctional isocyanate such as an aliphatic polyisocyanate including hexamethylenediisocyanate or xylenediisocyanate, on the one hand, and a compound containing a hydroxyl group such as polyetherpolyol, polyesterpolyol, or polyacrylatepolyol, on the other hand.

By using, in the present invention, a polyurethane resin as described above, it is possible to improve adhesion between the vapor-deposited film of silicon oxide and the heat-sealed resin layer, and elongation of the primer agent layer, including, for example, the post-working adaptability such as bag-making working, to prevent occurrence of cracks in the vapor-deposited film of silicon oxide during the post-working.

As a polyester resin forming the above-mentioned polyester resin composition in the above description, for example, a thermo-plastic polyester resin generated from polycondensation of one or more aromatic saturated dicarboxylic acid having a basic skeleton of a benzene nucleus such as terephthalic acid and one or more saturated dihydric alcohol can be used.

As an aromatic saturated dicarboxylic acid having a basic skeleton of a benzene nucleus in the above-description, for example, terephthalic acid, isophthalic acid, phthalic acid, diphenylether-4,4-dicarboxylic acid or the like may be used.

As a saturated dihydric alcohol in the above description, applicable materials include aliphatic glycols such as ethylene glycol, propylene glycol, trimethylene glycol, tetramethylene glycol, dimethylene glycol, polyethylene glycol, polypropylene glycol, polytetramethylene glycol, hexamethylene glycol, dodeca-methylene glycol and neopentyl glycol, aliphatic glycols such as cyclohexane dimethanol, and aromatic diols such as 2,2-bis(4'-.-hydroxyethoxyphenyl) propane, and naphthalenediol.

In the present invention, applicable polyester resins in the above description include, more specifically, thermo-plastic polyethyleneterephthalate resin produced by polycondensation of terephthalic acid and ethylene glycol, thermo-plastic poly-butyleneterephthalate resin produced by polycondensation of terephthalic acid and tetramethylene glycol, thermo-plastic poly-cyclohexane dimethyleneterephthalate resin produced by poly-condensation of terephthalicacid and 1,4-cyclohexane-dimethanol, thermo-plastic polyethyleneterephthalate resin produced by copolycondensation of terephthalic acid, isophthalic acid and ethylene glycol, thermo-plastic polyethylenephthalate resin produced by copolycondensation of terephthalic acid, ethylene glycol and 1,4-cyclohexanedimethanol, thermo-plastic polyethyleneterephthalate resin produced by copolycondensation of terephthalic acid, isophthalic acid, ethylene glycol and propylene glycol, and polyesterpolyol resin and the like.

In the present invention, it is also possible to cause copolycondensation by adding one or more of aliphatic saturated dicarboxylic acids such as malonic acid, succinic acid, glutaric acid, adipic acid, pimelic acid, suberic acid, azelaic acid, sebacic acid and dodecanoic acid to saturated aromatic dicarboxylic acid having the above-mentioned benzene nucleus as the basic skeleton. It is desirable to add such additives in an amount of from 1 to 10 wt. % relative to the aromatic saturated dicarboxylic acid having benzene nucleus as the basic skeleton.

In the present invention, close adhesion and elongation of the primer agent layer are improved by using a polyester resin as described above. For example, lamination or post-working adptability such as bag-making is improved, thereby preventing occurrence of cracks in the vapor-deposited film of the inorganic oxide during post working.

Applicable silane coupling agents composing the polyurethane or polyester resin composition in the above description, for which organic functional silane monomers having binary reactivity, include, for example, γ-chloropropylmethoxysilane, vinyltrichlorosilane, vinyltriethoxysilane, vinyl-tris-(β-methoxyethoxy)silane, γ-metacryloxypropyltrimethoxysilane, β-(3,4-epoxycyclohexyl)-ethyltrimethoxysilane, γ-glycidoxypropyltrimethoxysilane, vinyltriacetoxysilane, γ-mercaptopropyltrimethoxysilane, N-β(aminoethyl)-γ-amino-propyltrimethoxysilane, N-β(aminoethyl)-γ-aminopropylmethyldimethoxysilance, γ-ureidopropyltrimethoxysilane, bis(β-hydroxyethyl)-γ-aminopropyltriethoxysilane, and γ-amino-propylsilicone aqueous solution, one or more of which may be used.

In a silane coupling agent selected from the above, a functional group at an end of molecule, usually chloro, alcoxy, or acetoxy group is hydrolyzed, forms a silanol group (SiOH). This causes a reaction such as a dehydration/condenssation reaction under some effect of the metal composing the vapor-deposited film of an inorganic oxide such as silicon oxide or aluminum oxide, or an active group on the surface of the vapor-deposited film of the inorganic oxide such as silicon oxide or aluminum oxide, such as a functional group including a hydroxyl group. The silane coupling agent is modified through covalent bonding or the like on the surface of the vapor-deposited film of the inorganic oxide such as silicon oxide or aluminum oxide, and moreover, a strong bond is formed of the silanol group itself through adsorption or hydrogen bonding onto the surface of the vapor-deposited film of the inorganic oxide such as silicon oxide or aluminum oxide.

On the other hand, an organic functional group such as vinyl, metacryloxy, amino, epoxy or mercapto at the other end of the silane coupling agent is formed on the thin film of the silane coupling agent. For example, a strong bond is formed through reaction with a substance composing a printed pattern layer, a laminating adhesive layer, an anchor coating agent layer or other layer, and furthermore, a heat-sealing resin layer firmly and closely adheres via the above-mentioned printed pattern layer, laminating adhesive layer and anchor coating agent layer, thereby increasing the lamination strength. In the present invention, it is thus possible to form a strong lamination structure having a high lamination strength.

In the present invention, close adhesivity with the heat-sealing resin layer is improved by use of inorganic and organic properties of the silane coupling agent via the vapor-deposited film of silicon oxide, the printed pattern layer, the adhesive layer or the anchor coating agent layer, thereby improving lamination strength.

In the present invention, applicable filling agents forming the above-mentioned polyurethane or polyester resin composition include, for example, calcium carbonate, barium sulfate, alumina white, silica, talc, glass frit, resin powder and the like.

The above-mentioned filling agent adjusts viscosity of the polyurethane or polyester resin composition solution, improves coating adaptability thereof, and improves agglutination ability of the coating film while bonding via the polyurethane or polyester resin serving as a binder resin and the silane coupling agent.

The laminating adhesive layer forming the laminated member in the invention will now be described. Applicable adhesives composing the laminating adhesive layer include, for example, a polyvinyl acetate adhesive, polyacrylate ester adhesives such as homopolymers of ethyl, butyl and 2-ethylhexylester of acrylic acid, and copolymer thereof with methyl metacylate, acrylonitrile and styrene, cyanoacrylate adhesive, ethylene copolymer adhesives comprising copolymers of ethylene with monomers such as vinyl acetate, thylacrylate, acrylic acid and metacrylic acid, cellulose adhesives, polyester adhesives, polyamide adhesives, polyimide adhesive, amino resin adhesives comprising an urea resin or a melamine resin, phenol resin adhesives, epoxy adhesives, polyurethane adhesives, reactive (metal)acrylic adhesives, rubber adhesives comprising chloroprene rubber, nitrile rubber and styrene-butadiene rubber, silicone adhesives, inorganic adhesives such as alkali metal silicate and low-melting-point glass, and other adhesives.

The above-mentioned adhesive composition system may take any form of composition such as an aqueous type, a solution type, an emulsion type and a dispersion type. The shape may be any of a film-sheet shape, powder shape or solid shape. The adhesion mechanism may be any of the chemical reaction type, the solvent volatilization type, the heat melting type, and the thermal pressure type.

The above-mentioned adhesive may be applied by any of the roll coating method, the gravure roll coating method, the kiss-roll coating method and other coating methods and the printing methods. The amount of coating should preferably be within a range of from 0.1 to 10 g/m² (in dry).

The anchor coating agent layer forming the laminated member in the present invention will now be described. Applicable anchor coating agents forming the anchor coating agent layer include, for example, alkyltitanate and other organic titanium, isocyanate, polyethyleneimine, polybutadiene, and other aqueous and oily anchor coating agents.

The above-mentioned anchor coating agent may be coated by use of any of roll coating, gravure roll coating, kiss-roll coating and other coating methods. The amount of coating should preferably be within a range of from 0.1 to 5 g/m² (in dry).

Applicable resins for the melting extrusion resin layer in the above-mentioned melting extrusion laminating method include, for example, polyethylene resins, polypropylene resins, acid-denatured polyethylene resins, acid-denatured polypropylene resins, ethylene-acrylic acid or metacrylic acid copolymers, saline resins, ethylene-vinyl acetate copolymers, polyvinyl acetate resins, ethylene-acrylic acid ester or metacrylic acid ester copolymers, polystyrene resins, polyvinyl chloride resins, and other thermo-plastic resins, one or more of which may be used.

In order to obtain a higher adhesive strength in the above-mentioned melting extrusion laminating method, lamination may be accomplished via, for example, an anchor coating agent layer such as the above-mentioned anchor coating agent.

As an innermost layer of the laminated member or as a substrate such as a plastic film forming the outermost layer, for example, a film or a sheet of a heat sealing resin which is heat-melted and can be welded together may be used. More specifically, for example, low-density polyethylene, medium-density polyethylene, high-density polyethylene, straight-chain (linear) low-density polyethylene, ethylene-α-olefin copolymer obtained by polymerization by use of a metallocene catalyst, polypropylene, ethylene-vinyl acetate copolymer, ionomer resin, ethylene-acrylic acid copolymer, ethylene-ethylacrylate copolymer, ethylene-methylmetacrylate copolymer, ethylene-propylene copolymer, methylpentene polymer, polybutene polymer, acid-denatured polyolefin resin resulting from denaturation of a polyolefin resin such as polyethylene or polypropylene with a non-saturated carboxylic acid such as acrylic acid, metacrylic acid, maleic acid, maleic anhydride, phmalic acid or itaconic acid, a polyvinyl acetate resin, a poly(meta)acrylic resin, a polyvinyl chloride resin, or other resin is applicable in the form of a film or a sheet.

The above-mentioned film or sheet may be used in a state of a coating film by use of a composition containing such a resin.

The film or sheet should preferably have a thickness within a range of from about 5 to 300 μm, or more preferably, from about 10 to 100 μm.

As a substrate such as a plastic film forming the above-mentioned laminated member in the invention, a film or sheet of a resin which has excellent mechanical, physical, chemical and other properties as a basic material for a laminated member, is particularly strong and tough, and is heat resistant may be used. Applicable materials include, for example, a polyester resin, a polyamide resin, a polyaramide resin, a polyolefin resin, a polycarbonate resin, a polystyrene resin, a polyacetal resin, and a pluororesin, and a film or sheet of other tough resin may also be used.

Any of a non-drawn film and a film drawn in uniaxially or biaxially drawn film may be used as the film or sheet of the above resin.

The film should preferably have a thickness within a range of from about 5 to 100 μm, or more preferably, from about 10 to 50 μm.

In the present invention, desired images such as characters, graphics, signs, pictures or patterns may be printed on the surface or back of the above-mentioned substrate film.

As the substrate for forming the above-mentioned laminated member in the present invention, for example, any of various paper substrates forming a paper layer may be used. More particularly, a paper substrate used in the invention is to provide shape imparting property, bending resistance and rigidity, and applicable paper materials include, for example, bleached and non-bleached strongly sized paper substrates, pure-white rolled paper, craft paper, cardboard, and treated-paper substrates.

The above-mentioned paper substrate composing the paper layer should preferably have a unit weight within a range of from about 80 to 600 g/m², or more preferably, from about 100 to 450 g/m².

It is needless to mention that, in the present invention, it is possible to simultaneously use a paper substrate for preparing the paper layer and films and sheets of various resins for the substrate film as described above.

In the present invention, applicable materials for composing the above-mentioned laminated member include, for example, films or sheets of resins such as low-density polyethylene, medium-density polyethylene, high-density polyethylene, straight-chain low-density polyethylene, polypropylene, ethylene-propane copolymer which have barrier-formability against steam and water, films or sheets of resins such as polyvinylidene chloride, polyvinyl alcohol, and ethylene-vinyl acetate copolymer saponification products, which have barrier-formability against oxygen and steam, and films or sheets of various colored resins having light shielding property, which are made by kneading a resin added with a pigment or other coloring agent and a desired additives and forming the mixture into films. One or more in combination of these materials may be used.

The above-mentioned film or sheet should preferably have a thickness usually within a range of from about 5 to 300 µm, or more preferably, from about 10 to 100 µm, although the thickness is arbitrary.

In the present invention, the above-mentioned laminated member, applied to various uses, is usually subjected to physically and chemically very severe conditions. The laminated member must therefore satisfy strict requirements including deformation resistance, dropping impact resistance, pinhole resistance, heat resistance, close sealability, quality stability, operability, hygienics and other properties. In the present invention, therefore, a material satisfying these various requirements may be arbitrarily selected and used. More specifically, a material may arbitrarily be selected from, for example, low-density polyethylene, medium-density polyethylene, high-density polyethylene, linear low-density polyethylene, polypropylene, ethylene-propylene copolymer, ethylene-vinyl acetate copolymer, ionomer resin, ethylene-ethylacrylate copolymer, ethylene-acirylic or metacrylic acid copolymer, methylpentene polymer, polybutene resin, polyvinyl chloride resins, polyvinyl acetate resins, vinyl chloride-vinylidene chloride copolymer, poly(meta)acryl resins, polyacrylonitrile resins, polystyrene resins, acrylonitrile-styrene copolymers (AS resins), acrylonitrile-butadiene-styrene copolymers (ABS resins), polyester resins, polyamide resins, polycarbonate resins, polyvinylalcohol resins, ethylene-vinyl acetate copolymer saponification products, fluoro-resins, diene-resins, polyacetal resins, polyurethane resins, nitrocellulose, and other publicly known resins, used in the form of a film or a sheet. Cellophane film and synthetic paper are also applicable.

In the present invention, the above-mentioned films or sheets may be in a non-drawn state or ones drawn uniaxially or biaxially.

The thickness, which may be arbitrarily selected, may be selected from a range of from several µm to about 300 µm.

In the invention, the film or the sheet may be any of an extruded film, an inflation film and a coating film.

When conducting lamination in the invention, as required, a pretreatment such as a corona treatment or an ozone treatment may be applied to the film. It is possible to use publicly known pretreatment anchor coating agents and adhesives including, for example, isocyanate (urethane), polyethyleneimine, polybutadiene, and organic titanium anchor coating agents, and polyurethane, polyacryl, polyester, epoxy, polyvinyl acetate, cellulose, and other adhesives for lamination.

In the present invention, it is possible to form a printed pattern layer between any two layers composing the above-mentioned laminated member.

A printed pattern layer of the present invention can be formed by preparing an ink composition by using one or more kinds of ordinary ink vehicle as main constituents, adding, as required, arbitrarily one or more of a plasticizer, a stabilizer, an oxidation preventive agent, a light stabilizer, an ultraviolet-ray absorbent, a hardening agent, a crosslinking agent, a smoothing agent, an antistatic agent, a filler and other additives, further adding a coloring agent such as a dye or a pigment, and adjusting the ink composition by sufficiently kneading with a solvent or a diluent, then, using the thus prepared ink composition, using any of gravure printing, offset printing, relief printing, screen printing, transfer printing, flexoprinting and other printing methods, and printing a desired printed pattern comprising characters, graphics, symbols and pictures on the above-mentioned coating thin film.

In the present invention, the primer agent layer to be provided on the vapor-deposited film of an inorganic oxide such as silicon oxide or aluminum oxide may be formed by using a resin composition containing, as a main constituent of vehicle, a polyamide resin, an epoxy resin, a phenol resin, a (meta)acryl resin, a polyvinyl acetate resin, polyethylene-aluihapropylene or other polyolefin resin or a copolymer thereof or a denatured resin, a cellulose resin, or the like, apart from the above-mentioned primer agent layer based on the above-mentioned polyurethane or polyester resin composition.

In the present invention, the primer coating agent layer may be formed by coating by roll coating, gravure roll coating, kiss-roll coating or any other coating method. The amount of coating should preferably be within a range of from 0.1 to 10 g/m² (in dry).

The method of manufacturing a packaging container such as a bag or a box by use of the above-mentioned laminated member in the present invention will now be described. For example, in the case of a soft packaging bag comprising a plastic film, a bag can be formed by using laminated members manufactured by the method described above, folding the members so as to cause the inner heat-sealing film surfaces of the inner layer to face each other, or piling two members, and heat-sealing the peripheral edge to provide a sealed portion.

A packaging container of any of various forms of the present invention can be manufactured by folding the above-mentioned laminated members so as to cause the inner layer surfaces to face each other, or piling two members, and heat-sealing the outer peripheral edge thereof to form a side sealing type, two-side sealing type, three-side sealing type, four-side sealing type, envelope sealing type, joined hands sealing type (pillow sealing type), pleated sealing type, flat bottom sealing type, angled bottom sealing type, or other type of heat sealing.

In addition, it is also possible to manufacture a standing pouch, and in the present invention, furthermore, it is also possible to manufacture a tubular container by using the above-mentioned laminated members.

In the above description, heat sealing can be accomplished by any of the publicly known methods such as bar sealing, rotary roll sealing, belt sealing, impulse sealing, high-frequency sealing and ultrasonic sealing.

For example, a one-piece type, a two-piece type or other pouring port, or an opening closing zipper may be arbitrarily attached to the packaging container described above in the invention.

In the case of a liquid filling paper container containing paper substrates, as a kind of packaging container, a paper container for liquid of a brick type, a flat type or a gable top type can be manufactured by preparing a laminated member made by laminating paper substrates, manufacturing therefrom a blank sheet for making a desired paper container, and then, forming a barrel, a bottom and a top by use of the blank sheet.

Rectangular containers and round cylindrical paper cans can be manufactured.

In the present invention, packaging containers manufactured as above are applicable for filling-packaging of various eatables and drinkables, adhesive, bonding agent and other chemicals, cosmetic products, medicine, chemical portable body warmer and other sundries.

The packaging container of the present invention is useful for a pouch for liquid for filling-packaging soy sauce, sauce, soup and the like, for a soft packaging bag for filling-packaging unbaked sweets, for a soft-packaging bag for filling-packaging boiling or retort foods and other packaging containers for filling-packaging liquid foods and drinks or food containing liquid.

EXAMPLES

The present invention will now be described further in detail by means of examples.

In the following description of examples, steam permeability, oxygen permeability, degree of yellowing, amount of change in X-value of silicon oxide as expressed by a formula SiOx composing the vapor-deposited film were measured by the following measuring methods:

(1) Measurement of Steam Permeability:

For the barrier-forming films, steam permeability was measured with a measuring instrument made by MOCON Co., United States (Model PERMATRAN) under conditions including a temperature of 40° C. and a humidity of 90% RH.

(2) Measurement of Oxygen Permeability:

For the barrier-forming films, oxygen permeability was measured with a measuring instrument made by MOCON Co., United States. (Model OXTRAN) under conditions including a temperature of 23° C. and a humidity of 90% RH.

(3) Measurement of Degree of Yellowing:

For the barrier-forming films, the degree of yellowing was measured in accordance with the provisions of JIS-K7103: the degree of yellowing ($YI_0$) was measured before heating, and the degree of yellowing (YI) was measured again after heating. The difference between before and after was recorded as the degree of yellowing ($\Delta YI$).

(4) Measurement of Amount of Change in X-Value of Silicon Oxide Expressed By Formula SiOx Composing Vapor-Deposited Film:

For the barrier-forming films, elements on the surface of the vapor-deposited film of silicon oxide were analyzed by use of an X-ray photoelectron spectroscopy (XPS). The ratio of oxygen to silicon detected on the surface was determined. The ratio of oxygen to silicon 1 was considered to represent an X-value, and the amount of change in X-value between before and after heating under conditions described for the examples was measured and calculated.

(5) Measurement of Surface Roughness of Vapor-Deposited Film:

The surface roughness of the vapor-deposited film in the present invention was measured by use of an atomic force microscope (AFM).

For the barrier-forming films, the measurement was made by means of an atomic force microscope made by Digital Instruments Co., United States (Model NanoScope), and a single-crystal silicon probe made by Nanosensors Co., United States (Model NCH-10T).

On the assumption that the surface roughness was measured at "N" 256×256 data points in a measuring area 5×5 µm, with a height "Zi" of each data, and an average value "Zavg", the standard deviation of Z-values of all data. "Rms-value", was determined.

The standard deviation was determined because measurement of only a Max-Min difference in the measurement area, when there was a singular point, permitted measurement of only surface irregularities. The following formula 1 was used for calculation:

$$Rms \text{ value} = \sqrt{\sum \frac{(Zi - Zavg)^2}{N}}$$

Regarding the Rms-value obtained from the atomic force microscope, the surface roughness was measured for those of which surface irregularities were previously calibrated with known samples.

In the present invention, the surface roughness of the vapor-deposited film was separately measured with a scanning electron microscope (SEM).

For the barrier-forming films, the state of surface waves of the vapor-deposited film was confirmed by coating a cyanoacrylate adhesive onto the surface of the vapor-deposited film to protect the same, drying the coat, then cutting the substrate film having the vapor-deposited film of an inorganic oxide with a diamond knife, and taking a photo of the cur section at over 50,000 magnifications.

Furthermore, for a substrate film having a vapor-deposited film of an inorganic oxide formed thereon, it is also possible to confirm the state of surface waves (surface irregularities) of only the vapor-deposited film in the product form comprising laminated members by forming a laminated member (product state) by affixing a resin film onto the vapor-deposited film of the inorganic oxide, then, cutting the resultant laminated member with a diamond knife as above, and taking a photo at over 50,000 magnifications.

Then, the height of surface irregularities was measured with calipers from the photo of the surface waves (surface irregularities).

An actual value of height of each of the irregularities was calculated from the previously calibrated scale shown on the scanning electron microscope photo.

As to the surface irregularities determined from the above-mentioned scanning electron microscopic photo, the measuring area is smaller than in the atomic force microscope. While the atomic force microscope calculates surface irregularities from the entire surface, the scanning electron microscope can obtain information only from the cut section, making it impossible to obtain many measurements. The result of the scanning electron microscope (SEM) was therefore used as a range value representing the max-min difference of surface irregularities.

Range value=max−min

As a result, the max−min difference of the scanning electron microscope was substantially equal to the max−min difference available from the atomic force microscope, and it was possible to confirm the effect of the heating treatment or the annealing treatment comprising a heating treatment on surface irregularities.

This suggests as well that almost the same results are available both from the atomic force microscope and the scanning electron microscope.

(6) Measurement of Thermal Shrinkage of Substrate Film:

For the barrier-forming film, measurement was conducted in accordance with the provision of 6.3.5 measurement of thermal shrinkage of "JIS: C2318 Polyester Film for Electrical Uses".

Five test pieces having a width of about 20 mm and a length of 150 mm were taken in the flow direction and the width direction of the substrate film. Gauge marks were provided with a knife at a distance of about 100 mm at the center of each test piece.

The test piece was vertically suspended in a thermostatic box held at a set temperature ±3° C. After heating for a prescribed time, the test piece was taken out, and after holding for 30 minutes at room temperature, the gauge length was measured. Calculation was performed in accordance with the following formula to determine an average value:

Thermal shrinkage (%)=$[(L_1-L_2)/L_1]\times 100$ where, $L_1$ represents the gauge length (mm); and $L_2$, the gauge length (mm) after heating.

The thermal shrinkage was calculated for the flow direction as well as for the width direction.

(2) The biaxially drum polyethyleneterephthalate film having a thickness of 12 μm on which the 200 Å-thick vapor-deposited silicon oxide film as above was formed was wound on a winding roll. Then, the winding roll was placed in a chamber capable of adjusting the heating temperature. The following annealing treatment comprising a heating treatment temperature at a heating treatment temperature for a heating treatment time shown in Table 1 was applied, thereby manufacturing a barrier-forming film of the present invention having properties shown in Table 1.

In the Table A, A: heating temperature (unit: ° C.); B: heating time (unit: hours);. C: steam permeability (unit:. $g/m^2/day.40°$ C.90% RH); D: improvement ratio of steam permeability (unit: %); E: oxygen permeability (unit: $cc/m^2/day.23°$ C.90% RH); F: improvement ratio of oxygen permeability (unit: %); G: degree of yellowing measurement (1: degree of yellow; 2: degree of yellowing); H: X-value measurement (1: measured value; 2: amount of change); I: surface roughness of vapor-deposited film (1: AFM-value) (unit: nm); 2: Rms-value improvement ratio; 3: SEM-value); and J: thermal shrinkage of substrate film after heating treatment (unit: %; 1: flow direction; 2: width direction).

TABLE 1

| | | | | | | Heating condition | | | | | | | | |
|---|---|---|---|---|---|---|---|---|---|---|---|---|---|---|
| | | | | | | G | | H | | I | | | J | |
| A | B | C | D | E | F | 1 | 2 | 1 | 2 | 1 | 2 | 3 | 1 | 2 |
| — | — | 11.0 | — | 10.5 | — | 1.83 | — | 1.34 | — | 2.2 | — | 2.5 | 0 | 0 |
| 30 | 1 | 9.9 | 90 | 10.2 | 97 | 1.81 | 0.02 | 1.38 | 0.04 | 2.4 | 1.09 | 3 | −0.01 | 0 |
| 40 | 12 | 8.4 | 76 | 8.9 | 85 | 1.49 | 0.34 | 1.40 | 0.06 | 2.5 | 1.14 | 4 | −0.01 | 0 |
| 55 | 24 | 6.5 | 59 | 6.7 | 64 | 1.39 | 0.44 | 1.43 | 0.09 | 2.7 | 1.23 | 3 | −0.03 | 0 |
| | 48 | 1.7 | 15 | 1.9 | 18 | 1.12 | 0.71 | 1.38 | 0.04 | 3.3 | 1.50 | 4 | −0.05 | 0 |
| | 72 | 1.7 | 15 | 1.8 | 17 | 1.06 | 0.77 | 1.40 | 0.06 | 4.6 | 2.09 | 7 | −0.05 | +0.01 |
| | 120 | 1.8 | 16 | 1.6 | 15 | 1.02 | 0.81 | 1.44 | 0.10 | 6.2 | 2.82 | 9 | −0.07 | 0 |
| 75 | 24 | 1.7 | 15 | 1.3 | 12 | 0.98 | 0.85 | 1.46 | 0.12 | 7.2 | 3.27 | 11 | −0.08 | +0.01 |
| | 48 | 1.7 | 15 | 1.5 | 14 | 0.95 | 0.88 | 1.42 | 0.08 | 7.1 | 3.23 | 11 | −0.10 | +0.01 |
| | 72 | 1.6 | 14 | 1.4 | 13 | 0.92 | 0.81 | 1.45 | 0.11 | 8.6 | 3.91 | 13 | −0.12 | 0 |
| | 120 | 1.7 | 15 | 1.3 | 12 | 0.95 | 0.88 | 1.47 | 0.13 | 8.5 | 3.86 | 14 | −0.12 | 0 |
| 90 | 24 | 1.4 | 12 | 1.3 | 12 | 0.98 | 0.85 | 1.49 | 0.15 | 8.8 | 4.00 | 23 | −0.15 | +0.01 |
| | 48 | 1.5 | 14 | 1.5 | 14 | 0.90 | 0.93 | 1.47 | 0.13 | 9.1 | 4.14 | 28 | −0.16 | +0.01 |
| | 72 | 1.4 | 13 | 1.4 | 13 | 0.85 | 0.98 | 1.42 | 0.08 | 8.9 | 4.05 | 25 | −0.16 | 0 |
| 150 | 24 | 1.7 | 15 | 1.4 | 13 | 0.88 | 0.95 | 1.50 | 0.16 | 11.1 | 5.05 | 29 | −0.75 | +0.16 |
| | 48 | 1.6 | 15 | 1.4 | 13 | 0.87 | 0.96 | 1.47 | 0.13 | 10.9 | 4.95 | 30 | −0.83 | +0.18 |
| | 72 | 1.6 | 15 | 1.5 | 14 | 0.88 | 0.95 | 1.46 | 0.12 | 10.8 | 4.91 | 32 | −0.84 | +0.16 |

Example 1

(1) A biaxially drawn polyethyleneterephthalate film having a thickness of 12 μm was used. The film was charged through a delivery roll of a plasma chemical vapor depositing device. Then, a vapor-deposited film of silicon oxide having a thickness of 200 Å was formed on a corona-treated surface of this biaxially drawn polyethyleneterephthalate film under the following conditions:

(Vapor Depositing Conditions)

Vapor depositing surface: Corona-treated surface

Amount of introduced gas: hexamethyldisiloxane:oxygen gas:helium gas=1.0:3.0:3.0 (unit:slm)

Degree of vacuum in vacuum chamber: 2 to $6\times10^{-6}$ mBar

Degree of vacuum in vapor depositing chamber: 2 to $5\times10^{-3}$ mBar

Power fed to cooling/electrode drum: 10 kW

Line speed: 100 m/minute

As is clear from the result of measurement shown in Table 1, the barrier-forming film of the present invention showed an improvement of the vapor-deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed vapor-deposited silicon oxide film was confirmed.

Reference Example 1

(1) For the barrier-forming film manufactured through the heating treatment carried out under conditions including a temperature of 90° C. and a time of 24 hours in the aforementioned Example 1, an oxygen/argon mixed gas plasma treatment was applied to the surface of the vapor-deposited silicon oxide film by use of a glow discharge plasma generator, under conditions including a power of 9 kW; a mixed gas comprising a ratio of oxygen gas ($O_2$): argon gas (Ar)=7.0:2.5 (unit slm); a mixed gas pressure: $6\times10^{-5}$ Torr; and a treating rate of 420 m/minute, thereby forming a plasma-treated surface having a surface tension of the vapor-deposited silicon oxide film improved by more than 54 dyne/cm.

On the other hand, a low-density polyethylene resin layer having a thickness of 30 μm was formed, on one side of a paper substrate [weight: 425 g/m$^2$], by applying a corona discharge treatment, and then, extrusion-coating a low-density polyethylene resin on the corona-discharge-treated surface.

Then, a first extrusion-laminating process comprised the steps of using a tandem extrusion laminating machine, forming a polyethylene anchor coating agent layer on the non-coated surface of the above-mentioned paper substrate, then, arranging the anchor coating agent layer oppositely to the plasma-treated surface of the above-mentioned barrier-forming film, extrusion-laminating an ethylene-methacrylate copolymer (made by Mitsui Dupont Polychemical Co., product name: NUCLEL N0908C; extrusion temperature: 290° C.; extrusion thickness: 20 μm) over the gap between layers, and pasting the above-mentioned paper substrate and the barrier-forming film.

Then, a second extrusion-laminating process comprised the steps of coating a double-liquid hardening type anchor coating agent [made by Takeda Chemical Industries, Ltd.; product name: TAKELAC A3210/TAKENATE A3075; coating weight:. 1 g/m$^2$ (in dry)] with a gravure coater onto the surface of a 12 μm-thick biaxially drawn polyethylene-terephthalate film composing the above-mentioned barrier-forming film, passing the same through a drying oven, arranging an ethylene-α•.olefin copolymer film (made by Dainihon Resin Co., product name: JME-12N, film thickness: 40 μm) polymerized by use of a metallocene catalyst oppositely to the surface of the anchor coating agent layer, filling the gap between the layers with a low-density polyethylene resin (made by Mitsui Petrochemical Co., product name: M160, extrusion temperature: 320° C., extrusion thickness: 20 μm) by extrusion, and sandwiching polyethylene between the two layers, thereby manufacturing a laminated member.

(2) Then, a cylindrical sleeve was manufactured by using the thus manufactured laminated member, manufacturing a blank sheet having a margin for pasting through cutting of a longitudinal, transverse or diagonal bending line and stamping in response to the shape of a Gabel top type liquid paper container, then, applying a skive-heming end treatment to an end face of the thus manufactured blank sheet to prevent penetration or leakage of the contents, then, applying a hot air treatment to the pasting margin, melting a film of an ethylene-α-olefin copolymer polymerized by use of a metallocene catalyst at the pasting margin, placing the other end portion of the blank sheet onto the molten surface, and forming a barrel sealing portion by pasting the ends, thereby manufacturing a cylindrical sleeve.

A closely sealed liquid paper container of the invention was then manufactured by heating the bottom inner surface of the thus manufactured cylindrical sleeve by hot air, melting a film of an ethylene-α-olefin copolymer polymerized by use of a metallocene catalyst on the inner surface thereof, spray-sealing the same to form a bottom sealing portion, then, filling the cylinder with juice from the other opening, heating the top inner surface, melting the film of the ethylene-α-olefin copolymer polymerized by use of the metallocene catalyst, and applying press-sealing, thereby forming a Gabel top sealing portion.

In the thus manufactured closely sealed liquid paper container was free from occurrence of heating pinholes, excellent in barrier-formability against oxygen gas and steam, high in smell retaining property, free from deterioration of contents, excellent in lamination strength, resistant to distribution through the market, and in storage and preservation life.

Barrier-forming films manufactured as in Example 1 but under other heating conditions showed substantially the same result as above.

Example 2

(1) A 15 μm-thick biaxially drawn nylon 6 film was used as a substrate. This substrate was attached to a delivery roll of a plasma chemical vapor deposition device, and a 150 Å-thick vapor-deposited silicon oxide film was formed on one side of the above-mentioned biaxially drawn nylon 6 film under the following conditions:

(Vapor Depositing Conditions)
    Reaction gas mixing ratio: hexamethyldisiloxane:oxygen:helium=1:11:10 (unit:slm)
    Degree of vacuum in vacuum chamber: $5.2\times10^{-6}$ mBar
    Degree of vacuum in vapor deposition chamber: $5.1\times10^{-2}$ mBar
    Power fed to cooling/electrode drum: 18 kW
    Film conveying speed: 70 m/minute
    Vapor-deposited surface: corona-treated (2) Then, a barrier-forming film of the present invention having properties shown in Table 2 was manufactured by winding the 15 μm-thick biaxially drawn nylon 6 film on which a 150 Å-thick vapor-deposited silicon oxide film was formed as above onto a winding roll, then, placing the winding roll in a chamber (heating oven) capable of adjusting the heating temperature, and applying a heating treatment at a heating treatment temperature for a heating treatment time as shown in Table 2. Symbols and unit in Table 2 are the same as those in Table 1.

TABLE 2

| | | | | | | Heating condition | | | | | | | | |
| | | | | | | G | | H | | I | | | J | |
| A | B | C | D | E | F | 1 | 2 | 1 | 2 | 1 | 2 | 3 | 1 | 2 |
|---|---|---|---|---|---|---|---|---|---|---|---|---|---|---|
| — | — | 11.2 | — | 11.2 | | 1.83 | — | 1.34 | — | 2.3 | — | 2.5 | 0 | 0 |
| 30 | 1 | 10.0 | 89 | 10.8 | 96 | 1.82 | 0.01 | 1.39 | 0.05 | 2.4 | 1.04 | 3 | −0.01 | 0 |
| 40 | 12 | 8.5 | 76 | 9.5 | 85 | 1.50 | 0.33 | 1.41 | 0.07 | 2.4 | 1.04 | 4 | −0.01 | 0 |

TABLE 2-continued

| | | | | | | Heating condition | | | | | | | | |
|---|---|---|---|---|---|---|---|---|---|---|---|---|---|---|
| | | | | | | G | | H | | I | | | J | |
| A | B | C | D | E | F | 1 | 2 | 1 | 2 | 1 | 2 | 3 | 1 | 2 |
| 55 | 24 | 6.4 | 57 | 7.0 | 63 | 1.41 | 0.42 | 1.42 | 0.08 | 2.6 | 1.13 | 3 | −0.01 | +0.01 |
| | 48 | 1.6 | 14 | 1.9 | 17 | 1.14 | 0.69 | 1.39 | 0.05 | 3.0 | 1.30 | 4 | −0.06 | 0 |
| | 72 | 1.7 | 15 | 1.9 | 17 | 1.08 | 0.75 | 1.41 | 0.07 | 4.5 | 1.96 | 6 | −0.08 | +0.01 |
| | 120 | 1.6 | 14 | 1.7 | 15 | 1.03 | 0.80 | 1.46 | 0.12 | 6.5 | 2.83 | 13 | −0.08 | 0 |
| 75 | 24 | 1.8 | 16 | 1.5 | 13 | 0.99 | 0.84 | 1.48 | 0.14 | 7.3 | 3.17 | 12 | −0.10 | 0 |
| | 48 | 1.8 | 16 | 1.4 | 13 | 0.96 | 0.87 | 1.43 | 0.09 | 6.8 | 2.96 | 11 | −0.12 | 0 |
| | 72 | 1.5 | 13 | 1.4 | 13 | 0.94 | 0.89 | 1.47 | 0.13 | 8.3 | 3.61 | 13 | −0.13 | +0.01 |
| | 120 | 1.5 | 13 | 1.3 | 12 | 0.92 | 0.91 | 1.49 | 0.15 | 8.5 | 3.70 | 14 | −0.12 | +0.02 |
| 90 | 24 | 1.4 | 13 | 1.5 | 13 | 0.96 | 0.87 | 1.50 | 0.16 | 8.6 | 3.74 | 24 | −0.16 | +0.01 |
| | 48 | 1.4 | 13 | 1.4 | 13 | 0.88 | 0.95 | 1.45 | 0.11 | 9.1 | 3.96 | 26 | −0.19 | +0.01 |
| | 72 | 1.5 | 13 | 1.4 | 13 | 0.84 | 0.99 | 1.44 | 0.10 | 9.0 | 3.91 | 24 | −0.15 | +0.02 |
| 150 | 24 | 1.6 | 14 | 1.6 | 14 | 0.87 | 0.96 | 1.49 | 0.15 | 10.8 | 4.70 | 26 | −0.80 | +0.17 |
| | 48 | 1.7 | 15 | 1.4 | 13 | 0.86 | 0.97 | 1.46 | 0.12 | 10.8 | 4.70 | 27 | −0.86 | +0.15 |
| | 72 | 1.5 | 13 | 1.5 | 13 | 0.87 | 0.96 | 1.43 | 0.09 | 10.7 | 4.65 | 27 | −0.85 | +0.16 |

As is clear from the result of measurement shown in Table 2, the barrier-forming film of the present invention showed an improvement of the vapor-deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed vapor-deposited silicon oxide film was confirmed.

Reference Example 2

(1) Then, a plasma-treated surface was formed by using the barrier-forming film manufactured through the heating treatment at a temperature of 90° C. for a time of 24 hours in the aforementioned Example 2, and forming a plasma-treated surface on the surface of the vapor-deposited silicon oxide film in quite the same manner as in Example 1.

Then, a primer agent layer was formed on the plasma-treated surface of the vapor-deposited silicon oxide film of the barrier-forming film manufactured as above by coating a primer agent composition prepared by adding an epoxy silane coupling agent (8.0 wt. %) and an anti-blocking agent (1.0 wt. %) to an initial condensate of a polyurethane resin and sufficiently kneading the same, by the gravure roll coating method so as to achieve a thickness of 0.4 g/m² (in dry).

An adhesive layer for lamination was formed on the surface of the thus formed primer agent layer by coating a double-liquid hardening type polyurethane laminating adhesive by the gravure roll coating method as above so as to achieve a thickness of 4.0 g/m² (in dry).

Then, a laminated member was manufactured by placing a 50 μm-thick straight-chain low-density polyethylene film oppositely on the thus formed laminating adhesive layer surface to cause the corona-treated surface to face the same, and then, dry-laminating the both.

(2) Two laminated members manufactured as above were provided. The two members were piled up with the straight-chain low-density polyethylene film surfaces facing each other, and then, the outer peripheral edges were three-side-sealed to form a sealing portion, thereby manufacturing a three-side sealed type soft packaging pouch having an opening on the top.

The three-side sealed type soft packaging pouch manufactured as above was filling-packaged with soy sauce from the opening thereof. Then, a top sealing portion was formed by heat-sealing the opening, thereby manufacturing a liquid pouch packaging product.

The liquid pouch packaging product manufactured above was excellent in barrier-formability against oxygen gas and steam, in lamination strength, resistant to distribution in the market, and excellent in storage and preservation life.

Barrier-forming films manufactured as in Example 2 but under other heating conditions showed substantially the same result as above.

Example 3

(1) A 12 μm-thick biaxially drawn polyethyleneterephthalate film was used. A 200 Å-thick vapor-deposited silicon oxide film was formed by heating and evaporating silicon monoxide (SiO) having a purity of 99.9% by the high-frequency induction heating method in a vacuum of $1 \times 10^{-4}$ Torr on the corona-treated surface thereof.

(2) Then, a barrier-forming film of the present invention having properties shown in Table 3 was manufactured by winding the 12 μm-thick biaxially drawn polyethylene-terephthalate film on which a 200 Å-thick vapor-deposited silicon oxide film was formed as above onto a winding roll, then placing the winding roll in a chamber (heating oven) capable of adjusting the heating temperature, and applying a heating treatment at a heating treatment temperature for a heating treatment time as shown in Table 3. Symbols and units in Table 3 are the same as those in Table 1.

TABLE 3

| A | B | C | D | E | F | Heating condition ||||||||| 
| | | | | | | G ||  H || I ||| J ||
| | | | | | | 1 | 2 | 1 | 2 | 1 | 2 | 3 | 1 | 2 |
|---|---|---|---|---|---|---|---|---|---|---|---|---|---|---|
| — | — | 10.0 | — | 10.2 | — | 1.75 | — | 1.35 | — | 2.3 | — | 2.5 | 0 | 0 |
| 30 | 1 | 9.5 | 95 | 9.7 | 95 | 1.75 | 0.00 | 1.35 | 0.00 | 2.4 | 1.04 | 3 | −0.01 | 0 |
| 40 | 12 | 8.0 | 80 | 8.5 | 83 | 1.42 | 0.33 | 1.36 | 0.01 | 2.6 | 1.13 | 4 | −0.01 | 0 |
| 55 | 24 | 6.0 | 60 | 6.2 | 61 | 1.37 | 0.38 | 1.36 | 0.01 | 2.8 | 1.22 | 4 | −0.03 | 0 |
|  | 48 | 1.5 | 15 | 1.8 | 18 | 1.10 | 0.65 | 1.37 | 0.02 | 3.2 | 1.39 | 5 | −0.05 | 0 |
|  | 72 | 0.5 | 5 | 1.3 | 13 | 1.03 | 0.72 | 1.37 | 0.02 | 4.5 | 1.96 | 7 | −0.06 | +0.01 |
|  | 120 | 0.3 | 3 | 1.2 | 12 | 1.00 | 0.75 | 1.38 | 0.03 | 6.3 | 2.74 | 10 | −0.07 | 0 |
| 75 | 24 | 0.3 | 3 | 1.0 | 10 | 0.99 | 0.76 | 1.38 | 0.03 | 7.1 | 3.09 | 12 | −0.09 | 0 |
|  | 48 | 0.3 | 3 | 0.6 | 6 | 0.95 | 0.80 | 1.39 | 0.04 | 7.0 | 3.04 | 12 | −0.10 | +0.01 |
|  | 72 | 0.2 | 2 | 0.3 | 3 | 0.91 | 0.84 | 1.39 | 0.04 | 8.5 | 3.70 | 12 | −0.12 | +0.01 |
|  | 120 | 0.2 | 2 | 0.3 | 3 | 0.90 | 0.85 | 1.40 | 0.05 | 8.4 | 3.65 | 16 | −0.13 | 0 |
| 90 | 24 | 0.2 | 2 | 0.2 | 2 | 0.88 | 0.82 | 1.40 | 0.05 | 8.9 | 3.87 | 25 | −0.15 | 0 |
|  | 48 | 0.2 | 2 | 0.3 | 3 | 0.87 | 0.83 | 1.41 | 0.06 | 9.2 | 4.00 | 24 | −0.16 | +0.01 |
|  | 72 | 0.2 | 2 | 0.2 | 2 | 0.85 | 0.90 | 1.41 | 0.06 | 9.0 | 4.00 | 25 | −0.15 | +0.01 |
| 150 | 24 | 0.2 | 2 | 0.3 | 3 | 0.84 | 0.91 | 1.41 | 0.06 | 11.0 | 4.78 | 29 | −0.79 | +0.17 |
|  | 48 | 0.2 | 2 | 0.3 | 3 | 0.86 | 0.89 | 1.42 | 0.07 | 10.8 | 4.70 | 27 | −0.81 | +0.17 |
|  | 72 | 0.2 | 2 | 0.2 | 2 | 0.85 | 0.90 | 1.42 | 0.07 | 10.9 | 4.74 | 28 | −0.80 | +0.18 |

As is clear from the result of measurement shown in Table 3, the barrier-forming film of the present invention showed an improvement of the vapor-deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed vapor-deposited silicon oxide film was confirmed.

Reference Example 3

(1) Then, a plasma-treated surface having a surface tension of the vapor-deposited silicon oxide film improved by more than 54 dyne/cm was formed by using the barrier-forming film manufactured through the heating treatment at a temperature of 90° C. for a time of 24 hours in the aforementioned Example 3, and applying an oxygen/argon mixed gas plasma treatment to the surface of the vapor-deposited silicon oxide film, by use of a glow discharge plasma generator, using a power of 9 kW, with a mixed gas comprising oxygen gas ($O_2$): argon gas (Ar)=7.0:2.5 (unit: slm) under a mixed gas pressure of $6 \times 10^{-2}$ mBar at a treatment rate of 420 m/minute.

Then, a primer agent layer was formed on the plasma-treated surface of the vapor-deposited silicon oxide film of the barrier-forming film manufactured as above by coating a primer agent composition prepared by adding an epoxy silane coupling agent (8.0 wt. %) and an anti-blocking agent (1.0 wt. %) to an initial condensate of a polyethylene resin and sufficiently kneading the same, by the gravure roll coating method so as to achieve a thickness of 0.4 g/m² (in dry).

An adhesive layer for lamination was formed on the surface of the thus formed primer layer by coating a double-liquid hardening type polymethane laminating adhesive by the gravure roll coating method as above so as to achieve a thickness of 4.0 g/m² (in dry).

Then, a laminated member was manufactured by placing a 50 μm-thick straight-chain low-density polyethylene film oppositely on the thus formed laminating adhesive layer surface to cause the corona-treated surface to face the same, and then, dry-laminating the both.

(2) Two laminated members manufactured as above were provided. The two members were piled up with the straight-chain low-density polyethylene film surfaces facing each other, and then, the outer peripheral edges were three-side-sealed to form a sealing portion, thereby manufacturing a three-side-sealed type soft packaging pouch having an opening on the top.

The three-side-sealed type soft packaging pouch manufactured as above was filling-packaged with soy sauce from the opening thereof. Then, a top sealing portion was formed by heat-sealing the opening, thereby manufacturing a liquid pouch packaging product.

The liquid pouch packaging product manufactured above was excellent in barrier-formability against oxygen gas and steam, in lamination strength, resistant to distribution in the market, and excellent in storage and preservation life.

Barrier-forming films manufactured as in Example 3 but under other heating conditions showed substantially the same result as above.

Example 4

(1) A 200 Å-thick vapor-deposited silicon oxide film was formed by using a 15 μm-thick biaxially drawn nylon 6 film, and heating and evaporating silicon monoxide (SiO) having a purity of 99.9% by the high-frequency induction heating method in a vacuum of $1 \times 10^{-4}$ Torr on the corona-treated surface thereof.

(2) A barrier-forming film of the present invention having the properties shown in Table 4 by winding the 15 μm-thick biaxally drawn nylon 6 film on which the 200 Å-thick vapor-deposited silicon oxide film was formed as above, and then applying a heating treatment at a heating treatment temperature for a heating treatment time as shown in Table 4 to the winding roll placed in a chamber (heating oven) capable of adjusting the heating temperature. The symbols and units in Table 4 are the same as those in Table 1.

TABLE 4

| | | | | | | Heating condition | | | | | | | | |
|---|---|---|---|---|---|---|---|---|---|---|---|---|---|---|
| | | | | | | G | | H | | I | | | J | |
| A | B | C | D | E | F | 1 | 2 | 1 | 2 | 1 | 2 | 3 | 1 | 2 |
| — | — | 10.3 | — | 10.4 | — | 1.76 | — | 1.34 | — | 2.4 | — | 2.5 | 0 | 0 |
| 30 | 1 | 9.3 | 90 | 9.5 | 91 | 1.75 | 0.01 | 1.35 | 0.01 | 2.5 | 1.04 | 3 | −0.01 | 0 |
| 40 | 12 | 7.8 | 76 | 8.3 | 80 | 1.43 | 0.33 | 1.37 | 0.03 | 2.5 | 1.04 | 4 | −0.01 | 0 |
| 55 | 24 | 5.9 | 57 | 6.1 | 59 | 1.38 | 0.38 | 1.37 | 0.03 | 2.7 | 1.13 | 4 | −0.03 | 0 |
| | 48 | 1.7 | 17 | 1.9 | 18 | 1.12 | 0.64 | 1.38 | 0.04 | 3.1 | 1.29 | 5 | −0.05 | 0 |
| | 72 | 0.6 | 6 | 1.6 | 15 | 1.06 | 0.70 | 1.38 | 0.04 | 4.4 | 1.83 | 8 | −0.06 | +0.01 |
| | 120 | 0.4 | 4 | 1.3 | 13 | 1.02 | 0.74 | 1.37 | 0.03 | 6.4 | 2.67 | 11 | −0.07 | 0 |
| 75 | 24 | 0.4 | 4 | 1.2 | 12 | 0.97 | 0.79 | 1.40 | 0.06 | 7.2 | 3.00 | 13 | −0.09 | 0 |
| | 48 | 0.4 | 4 | 0.7 | 7 | 0.95 | 0.81 | 1.39 | 0.05 | 6.9 | 2.88 | 13 | −0.10 | +0.01 |
| | 72 | 0.3 | 3 | 0.4 | 4 | 0.92 | 0.84 | 1.39 | 0.05 | 8.4 | 3.50 | 12 | −0.12 | +0.01 |
| | 120 | 0.2 | 2 | 0.3 | 3 | 0.90 | 0.86 | 1.40 | 0.06 | 8.3 | 3.46 | 15 | −0.13 | 0 |
| 90 | 24 | 0.2 | 2 | 0.3 | 3 | 0.93 | 0.83 | 1.41 | 0.07 | 8.8 | 3.67 | 26 | −0.15 | 0 |
| | 48 | 0.2 | 2 | 0.3 | 3 | 0.87 | 0.89 | 1.41 | 0.07 | 9.0 | 3.75 | 27 | −0.16 | +0.01 |
| | 72 | 0.2 | 2 | 0.2 | 2 | 0.85 | 0.91 | 1.42 | 0.08 | 8.9 | 3.71 | 26 | −0.15 | +0.01 |
| 150 | 24 | 0.2 | 2 | 0.4 | 4 | 0.80 | 0.96 | 1.43 | 0.09 | 10.9 | 4.54 | 28 | −0.79 | +0.17 |
| | 48 | 0.2 | 2 | 0.3 | 3 | 0.83 | 0.93 | 1.42 | 0.07 | 10.7 | 4.46 | 29 | −0.81 | +0.17 |
| | 72 | 0.2 | 2 | 0.3 | 3 | 0.83 | 0.93 | 1.43 | 0.09 | 10.8 | 4.50 | 29 | −0.80 | +0.18 |

As is clear from the result of measurement shown in Table 4, the barrier-forming film of the present invention showed an improvement of the vapor-deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed-vapor-deposited silicon oxide film was confirmed.

Reference Example 4

(1) A primer agent layer was formed in quite the same manner as in the aforementioned Reference Example 3 on the plasma-treated surface of the vapor-deposited silicon oxide film of the barrier-forming film manufactured through the heating treatment at a temperature of 90° C. for a time of 24 hours in the aforementioned Example 4.

Then, an anchor coating agent layer was formed on the surface of the primer layer formed as above by using a double-liquid hardening type urethane anchor coating agent, coating the same by the gravure roll coating method so as to achieve a thickness of 0.1 g/m² (in dry).

Then, a laminated member was manufactured on the surface of the anchor coating agent layer formed as above by using a straight-chain low-density polyethylene resin, melting-extruding the same by use of an extruder, extruding a 50 μm-thick straight-chain low-density polyethylene resin layer, and laminating the same.

(2) Two laminated members manufactured as above were provided. The two members were piled up with the straight-chain low-density polyethylene film surfaces facing each other, and then, the outer peripheral edges were three-side-sealed to form a sealing portion, thereby manufacturing a three-side-sealed type soft packaging pouch having an opening on the top.

The three-side-sealed type soft packaging pouch manufactured as above was filling-packaged with soy sauce from the opening thereof. Then, a top sealing portion was formed by heat-sealing the opening, thereby manufacturing a liquid pouch packaging product.

The liquid pouch packaging product manufactured above was excellent in barrier-formability against oxygen gas and steam in lamination strength, resistant to distribution in the market, and excellent in storage and preservation life.

Barrier-forming films manufactured as in Example 4 but under other heating conditions showed substantially the same result as above.

Example 5

(1) A 30 nm-thick vapor-deposited silicon oxide film was formed by using, as substrate film, a 12 μm-thick biaxially drawn polyethyleneterephthalate film, winding the biaxially drawn polyethyleneterephthalate film onto a delivery roll of a winding type vacuum vapor depositing device, then, delivering the same, and vapor-depositing silicon monoxide (SiO) from a vapor deposition source while feeding oxygen gas by the vacuum vapor deposition method based on heating of electron beam (EB) onto the corona-treated surface of the biaxially drawn polyethyleneterephthalate film under the following vapor depositing conditions:

(Vapor Depositing Condition)
Degree of vacuum in vapor depositing chamber: $1.33 \times 10^{-2}$ Pa ($1 \times 10^{-4}$ Torr)
Degree of vacuum in winding chamber: $1.33 \times 10^{-2}$ Pa
Electron beam power: 25 kW
Film conveying speed: 400 m/minute
Vapor-deposited surface: corona-treated surface Then, a plasma-treated surface was formed by using a glow discharge plasma generator, immediately after forming the 30 nm-thick vapor-deposited silicon oxide film as above, using a mixed gas comprising oxygen gas:argon gas=7.0:2.5 (unit: slm) with a power of 9 kW, and applying an oxygen/argon mixed gas plasma treatment to the surface of the vapor-deposited silicon oxide film, under a mixed gas pressure of $6 \times 10^{-5}$ Torr.

(2) Then, a barrier-forming film of the invention having properties shown in Table 5 was manufactured by winding the 12 μm-thick biaxially drawn polyethyleneterephthalate film on which the 30 nm-thick vapor-deposited silicon oxide film was formed onto a winding roll, and then, applying a heating treatment at a heating treatment temperature for a heating treatment time shown in Table 5 to the winding roll placed in a chamber (heating oven) capable of adjusting the heating temperature. The symbols and units in Table 5 are the same as those in Table 1.

corona-treated surface in the same manner as above so as to achieve a thickness of 4.0 g/m², thereby forming a laminating adhesive layer.

TABLE 5

| | | | | | | Heating condition | | | | | | | | |
|---|---|---|---|---|---|---|---|---|---|---|---|---|---|---|
| | | | | | | G | | H | | I | | | J | |
| A | B | C | D | E | F | 1 | 2 | 1 | 2 | 1 | 2 | 3 | 1 | 2 |
| — | — | 10.0 | — | 1.8 | | 1.75 | — | 1.35 | — | 2.4 | — | 2.5 | 0 | 0 |
| 30 | 1 | 9.5 | 95 | 1.7 | 94 | 1.75 | 0.00 | 1.35 | 0 | 2.6 | 1.08 | 3 | −0.01 | 0 |
| 40 | 12 | 7.5 | 75 | 1.6 | 89 | 1.45 | 0.30 | 1.37 | 0.02 | 2.7 | 1.13 | 4 | −0.02 | 0 |
| 55 | 24 | 6.0 | 60 | 1.4 | 78 | 1.40 | 0.35 | 1.37 | 0.02 | 3.8 | 1.58 | 5 | −0.02 | 0 |
| | 48 | 2.0 | 20 | 1.4 | 78 | 1.15 | 0.60 | 1.36 | 0.01 | 4.2 | 1.75 | 5 | −0.04 | 0 |
| | 72 | 0.8 | 8 | 1.4 | 78 | 1.00 | 0.75 | 1.37 | 0.02 | 4.5 | 1.88 | 7 | −0.05 | +0.01 |
| | 120 | 0.5 | 5 | 1.3 | 72 | 1.00 | 0.75 | 1.38 | 0.03 | 5.9 | 2.46 | 11 | −0.07 | 0 |
| 75 | 24 | 0.4 | 4 | 1.0 | 55 | 0.99 | 0.76 | 1.38 | 0.03 | 8.7 | 3.63 | 12 | −0.10 | 0 |
| | 48 | 0.3 | 3 | 0.9 | 50 | 0.96 | 0.79 | 1.39 | 0.04 | 8.8 | 3.67 | 13 | −0.11 | +0.01 |
| | 72 | 0.2 | 2 | 0.7 | 39 | 0.90 | 0.85 | 1.39 | 0.04 | 8.8 | 3.67 | 13 | −0.13 | +0.01 |
| | 120 | 0.2 | 2 | 0.6 | 33 | 0.89 | 0.86 | 1.39 | 0.04 | 9.0 | 3.75 | 16 | −0.13 | 0 |
| 90 | 24 | 0.2 | 2 | 0.5 | 28 | 0.88 | 0.82 | 1.40 | 0.05 | 9.5 | 3.96 | 27 | −0.15 | 0 |
| | 48 | 0.2 | 2 | 0.6 | 33 | 0.87 | 0.83 | 1.41 | 0.06 | 9.8 | 4.08 | 27 | −0.17 | +0.01 |
| | 72 | 0.2 | 2 | 0.6 | 33 | 0.85 | 0.90 | 1.41 | 0.06 | 9.7 | 4.04 | 28 | −0.16 | +0.02 |
| 150 | 24 | 0.2 | 2 | 0.6 | 33 | 0.85 | 0.90 | 1.41 | 0.06 | 14.0 | 5.83 | 29 | −0.81 | +0.18 |
| | 48 | 0.2 | 2 | 0.7 | 39 | 0.85 | 0.90 | 1.42 | 0.07 | 13.8 | 5.75 | 30 | −0.80 | +0.18 |
| | 72 | 0.2 | 2 | 0.5 | 28 | 0.86 | 0.89 | 1.42 | 0.07 | 13.9 | 5.79 | 29 | −0.81 | +0.18 |

As is clear from the result of measurement shown in Table 5, the barrier-forming film of the present invention showed an improvement of the vapor-deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed vapor-deposited silicon oxide film was confirmed.

Reference Example 5

A transparent resin primer agent layer having a thickness within a range of from 0.7 to 0.8 g/m² (in dry) was formed by coating, by the gravure roll coating method, a primer agent having a polyester resin (glass transition point: 67° C.; molecular weight: 18,000) as a main constituent of vehicle and added with ethyl acetate as a diluent solvent onto the surface of the vapor-deposited silicon oxide film of the barrier-forming film manufactured through the heating treatment at a temperature of 90° C. for a time of 24 hours in the aforementioned Example 5, and then, applying a heating treatment at 80° C. for a minute.

Then, after forming a desired printed pattern on the surface of the thus formed transparent resin primer agent layer, a double-liquid hardening type polyurethane laminating adhesive was coated by the gravure roll coating method onto the entire surface including the printed pattern so as to achieve a thickness of 4.0 g/m² (in dry), and then dried, thereby forming a laminating adhesive layer. Then, a 15 μm-thick biaxially drawn nylon 6 film was placed on the surface of the laminating adhesive layer so as to cause the corona-treated surfaces to face each other, and the both were dry-laminated.

Then, after applying a corona discharge treatment to the surface of the thus laminated biaxially drawn nylon 6 film, a double-liquid hardening polyurethane laminating adhesive was coated by the gravure roll coating method onto the Then, a 60 μm-thick non-drawn polyethylene film was dry-laminated onto the surface of the thus formed laminating adhesive layer, thereby manufacturing a laminated member.

(2) Then, two laminated members manufactured as above were provided. The two members were piled up with the 60 μm-thick non-drawn polypropylene film surfaces facing each other, and then, the outer peripheral edges were three-side-sealed to form a sealing portion, thereby manufacturing a three-side-sealed type soft packaging pouch having an opening on the top.

The three-side-sealed type soft packaging pouch was filling-packaged with water through the opening, thereby manufacturing a packaging semi-product by heat-sealing the opening. Then, the thus manufactured packaging semi-product was placed in a retort kettle, and a retort treatment was applied under retort treatment conditions including a temperature of 120° C., a pressure of 2.1 kgf/cm².G and a time of 30 minutes, thereby manufacturing a retort packaged food product.

The packaging bag of the thus manufactured retort-packaged food was excellent in heat resistance, pressure resistance, water resistance, barrier-formability, heat sealability, pinhole resistance, sticking resistance, and transparency, excellent in barrier-formability against oxygen gas and steam, free from bag breakage or leakage of contents, and excellent in functions as a food container such as filling-packaging adaptability of contents, distribution adaptability and storage adaptability.

Before the retort treatment, the barrier-formability was represented by an oxygen permeability of 0.38 cc/m²/day.23° C.90% RH, a steam permeability of 0.22 g/M²/day.40° C.90% RH, and after the retort treatment, by an oxygen permeability of 0.56 cc/m²/day.23° C.90% RH and a steam permeability of 0.76 g/m²/day.40° C.90% RH.

Barrier-forming films manufactured as in Example 5 but under other heating conditions showed substantially the same result as above.

Example 6

(1) A 15 μm-thick biaxially drawn nylon 6 film was used as a substrate film. The biaxially drawn nylon 6 film was attached onto a delivery roll of a winding type vacuum depositing device, and then delivered. A 200 Å-thick vapor-deposited aluminum oxide film was formed under the following vapor depositing conditions by the vacuum vapor depositing method based on electron beam (EB) heating method while feeding oxygen gas with aluminum as a vapor depositing source on the corona-treated surface of the biaxially drawn nylon 6 film.

(Vapor Depositing Conditions)
Degree of vacuum in the vapor depositing chamber: $2 \times 10^{-4}$ mBar
Degree of vacuum in the winding chamber: $2 \times 10^{-2}$ mBar
Electron beam power: 25 kW
Film conveying speed: 420 m/minute
Vapor-deposited surface: corona-treated surface (2) Then, a barrier-forming film of the present invention having properties as shown in Table 6 was manufactured by winding the 15 μm-thick biaxially drawn nylon 6 film on which the 200 Å-thick vapor-deposited aluminum oxide film was formed as above on a winding roll, then, placing the winding roll in a chamber (heating oven) capable of adjusting the heating temperature, and applying a heating treatment at a heating treatment temperature for a heating treatment time as shown in Table 6. The symbols and units in Table 6 are the same as those in Table 1.

method, by use of an ordinary gravure ink composition, on one side of the 12 μm-thick biaxially drawn polyethyleneterephthalate film.

Then, a laminating adhesive layer was formed by coating a double-liquid hardening type polyurethane laminating adhesive by the gravure roll coating method so as to achieve a thickness of 4.0 g/m² (in dry) over the entire surface including the printed pattern layer formed as above.

Then, the barrier-forming film manufactured through a heating treatment under conditions including a temperature of 90° C. and a time of 24 hours in the above-mentioned Example 6 was placed on the surface of the laminating adhesive layer formed as above so that the surface of the vapor-deposited aluminum oxide faces the same, and then, the both were dry-laminated.

Then, a corona treatment was applied to the surface of the biaxially drawn nylon 6 film of the thus dry-laminated barrier-forming film, and a laminating adhesive layer was formed by coating a double-liquid hardening type polyurethane laminating adhesive onto the corona-treated surface by the gravure roll coating method, so as to achieve a thickness of 4.0 g/m² (in dry).

TABLE 6

| | | | | | | Heating condition | | | | | | | | |
| | | | | | | G | | H | | I | | | J | |
| A | B | C | D | E | F | 1 | 2 | 1 | 2 | 1 | 2 | 3 | 1 | 2 |
|---|---|---|---|---|---|---|---|---|---|---|---|---|---|---|
| — | — | 10.1 | — | 1.8 | — | 1.76 | — | 1.34 | — | 2.3 | — | 2.5 | 0 | 0 |
| 30 | 1 | 9.4 | 93 | 1.6 | 89 | 1.75 | 0.01 | 1.35 | 0.01 | 2.4 | 1.04 | 3 | −0.01 | 0 |
| 40 | 12 | 7.6 | 75 | 1.7 | 94 | 1.46 | 0.30 | 1.38 | 0.04 | 2.4 | 1.04 | 4 | −0.01 | 0 |
| 55 | 24 | 6.1 | 60 | 1.5 | 83 | 1.38 | 0.38 | 1.38 | 0.04 | 2.6 | 1.13 | 5 | −0.02 | 0 |
| | 48 | 2.5 | 25 | 1.6 | 89 | 1.10 | 0.66 | 1.38 | 0.04 | 3.0 | 1.30 | 5 | −0.07 | +0.01 |
| | 72 | 1.5 | 15 | 1.6 | 89 | 1.05 | 0.71 | 1.37 | 0.03 | 4.5 | 1.96 | 7 | −0.07 | +0.01 |
| | 120 | 0.7 | 7 | 1.3 | 72 | 1.01 | 0.75 | 1.37 | 0.03 | 6.5 | 2.83 | 11 | −0.09 | +0.01 |
| 75 | 24 | 0.5 | 5 | 1.1 | 61 | 0.96 | 0.80 | 1.38 | 0.04 | 7.3 | 3.17 | 13 | −0.10 | 0 |
| | 48 | 0.4 | 4 | 1.0 | 56 | 0.94 | 0.82 | 1.38 | 0.04 | 7.4 | 3.22 | 12 | −0.11 | 0 |
| | 72 | 0.2 | 2 | 0.8 | 44 | 0.90 | 0.86 | 1.39 | 0.05 | 8.9 | 3.87 | 14 | −0.12 | +0.02 |
| | 120 | 0.2 | 2 | 0.6 | 33 | 0.90 | 0.86 | 1.39 | 0.05 | 8.7 | 3.78 | 15 | −0.14 | +0.02 |
| 90 | 24 | 0.2 | 2 | 0.5 | 28 | 0.91 | 0.85 | 1.40 | 0.06 | 9.0 | 3.91 | 27 | −0.17 | +0.01 |
| | 48 | 0.3 | 3 | 0.6 | 33 | 0.90 | 0.86 | 1.40 | 0.06 | 9.1 | 3.96 | 26 | −0.17 | +0.02 |
| | 72 | 0.2 | 2 | 0.5 | 28 | 0.85 | 0.91 | 1.40 | 0.06 | 9.0 | 3.91 | 27 | −0.18 | +0.01 |
| 150 | 24 | 0.2 | 2 | 0.5 | 28 | 0.80 | 0.95 | 1.41 | 0.07 | 11.0 | 4.78 | 29 | −0.85 | +0.17 |
| | 48 | 0.2 | 2 | 0.6 | 33 | 0.82 | 0.94 | 1.42 | 0.08 | 10.8 | 4.70 | 30 | −0.86 | +0.18 |
| | 72 | 0.2 | 2 | 0.5 | 28 | 0.82 | 0.94 | 1.41 | 0.07 | 10.8 | 4.70 | 30 | −0.88 | +0.19 |

As is clear from the result of measurement shown in Table 6, the barrier-forming film of the present invention showed an improvement of the vapor deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed vapor-deposited silicon oxide film was confirmed.

Reference Example 6

(1) A printed pattern layer was formed by printing a prescribed printed pattern comprising characters, graphics, symbols, pictures and the like by the gravure printing Then, a laminated member was manufactured by dry-laminating a 60 μm-thick non-drawn polypropylene film onto the surface of the thus formed laminating adhesive layer.

(2) Then, two laminated members manufactured as above were provided. The two members were piled up so that the non-drawn polypropylene surfaces face each other, and then, the outer peripheral edges were three-side-sealed to form a sealing portion, thereby manufacturing a three-side-sealed type soft packaging pouch having an opening on the top.

The three-side-sealed type soft packaging pouch manufactured as above was filling-packaged with water from the opening thereof. Then, a top sealing portion was formed by heat-sealing the opening, thereby manufacturing a packaging semi-product. Then, the packaging semi-product was placed in a retort kettle, and a retort treatment was applied under conditions including a temperature of 120° C., a pressure of 2.1 kgf/cm².G, and a time of 30 minutes, thereby manufacturing a retort food product of the present invention.

The packaging pouch of the resort food product manufactured as above was excellent in heat resistance, pressure resistance, barrier-formability, heat-sealability, pinhole resistance, picking resistance, and transparency, and excellent in barrier-formability against oxygen gas and steam, free from bag breakage or leakage of the contents, and excellent in functions as a food container including, for example, filling-packaging adaptability of contents, distribution adaptability, and storage adaptability.

The barrier-formability before the retort treatment was represented by an oxygen permeability of 0.50 cc/m²/day.23° C.90% RH, and a steam permeability of 0.26 g/m²/day.40° C.90% RH, whereas that after the retort treatment, by an oxygen permeability of 0.56 cc/m²/day.23° C.90% RH and a steam permeability of 0.38 g/m²/day.40° C.90% RH.

Barrier-forming films manufactured as in Example 6 but under other heating conditions showed substantially the same result as above.

Film conveying speed: 400 m/minute

Vapor-deposited surface: corona-treated surface

Then, a plasma-treated surface was formed by using a glow discharge plasma generator, immediately after forming the 30 nm-thick vapor-deposited silicon oxide film as above, using a mixed gas comprising oxygen gas:argon gas=7.0:2.5 (unit: slm) with a power of 9 kW, and applying an oxygen/argon mixed gas plasma treatment to the surface of the vapor-deposited silicon oxide film, under a mixed gas pressure of $6 \times 10^{-5}$ Torr.

(2) Then, a barrier-forming film of the invention having properties shown in Table 7 was manufactured by winding the 12 μm-thick biaxially drawn polyethyleneterephthalate film on which the 30 nm-thick vapor-deposited silicon oxide film was formed onto a winding roll, and then, applying a heating treatment at a heating treatment temperature for a heating treatment time shown in Table 7 to the winding roll placed in a chamber (heating oven) capable of adjusting the heating temperature. The symbols and units in Table 7 are the same as those in Table 1.

TABLE 7

| | | | | | | Heating condition | | | | | | | | |
|---|---|---|---|---|---|---|---|---|---|---|---|---|---|---|
| | | | | | | G | | H | | I | | | J | |
| A | B | C | D | E | F | 1 | 2 | 1 | 2 | 1 | 2 | 3 | 1 | 2 |
| — | — | 10.0 | — | 1.8 | — | 1.75 | — | 1.35 | — | 2.3 | — | 2.5 | 0 | 0 |
| 30 | 1 | 9.2 | 92 | 1.7 | 94 | 1.75 | 0.00 | 1.35 | 0.00 | 2.6 | 1.13 | 3 | −0.01 | 0 |
| 40 | 12 | 7.3 | 73 | 1.7 | 94 | 1.42 | 0.33 | 1.38 | 0.03 | 2.9 | 1.26 | 4 | −0.01 | 0 |
| 55 | 24 | 6.0 | 60 | 1.5 | 83 | 1.40 | 0.35 | 1.37 | 0.02 | 3.9 | 1.70 | 5 | −0.03 | 0 |
| | 48 | 2.0 | 20 | 1.4 | 78 | 1.15 | 0.60 | 1.38 | 0.03 | 4.4 | 1.91 | 5 | −0.04 | +0.01 |
| | 72 | 0.9 | 9 | 1.5 | 83 | 1.02 | 0.73 | 1.37 | 0.02 | 4.6 | 2.00 | 8 | −0.04 | +0.01 |
| | 120 | 0.5 | 5 | 1.4 | 78 | 1.00 | 0.75 | 1.39 | 0.04 | 5.9 | 2.57 | 11 | −0.06 | 0 |
| 75 | 24 | 0.5 | 5 | 1.0 | 56 | 0.99 | 0.76 | 1.38 | 0.03 | 8.6 | 3.74 | 13 | −0.10 | 0 |
| | 48 | 0.3 | 3 | 0.9 | 50 | 0.95 | 0.80 | 1.39 | 0.04 | 8.8 | 3.83 | 13 | −0.12 | +0.01 |
| | 72 | 0.2 | 2 | 0.7 | 39 | 0.90 | 0.85 | 1.40 | 0.05 | 8.9 | 3.87 | 14 | −0.13 | +0.01 |
| | 120 | 0.3 | 3 | 0.7 | 39 | 0.88 | 0.87 | 1.40 | 0.05 | 9.0 | 3.91 | 16 | −0.12 | +0.01 |
| 90 | 24 | 0.2 | 2 | 0.5 | 28 | 0.87 | 0.88 | 1.40 | 0.05 | 9.3 | 4.04 | 26 | −0.14 | 0 |
| | 48 | 0.2 | 2 | 0.7 | 39 | 0.87 | 0.83 | 1.42 | 0.07 | 9.7 | 4.22 | 28 | −0.16 | +0.01 |
| | 72 | 0.3 | 3 | 0.6 | 33 | 0.85 | 0.90 | 1.42 | 0.07 | 9.8 | 4.26 | 28 | −0.16 | +0.02 |
| 150 | 24 | 0.2 | 2 | 0.5 | 28 | 0.86 | 0.89 | 1.41 | 0.06 | 14.2 | 6.17 | 28 | −0.75 | +0.18 |
| | 48 | 0.3 | 3 | 0.6 | 33 | 0.85 | 0.90 | 1.42 | 0.07 | 14.0 | 6.09 | 30 | −0.72 | +0.19 |
| | 72 | 0.2 | 2 | 0.6 | 33 | 0.86 | 0.89 | 1.42 | 0.07 | 14.5 | 6.30 | 29 | −0.80 | +0.20 |

Example 7

(1) A 12 μm-thick biaxially drawn polyethyleneterephthalate film previously coated with polyesterpolyol in an amount of 0.1 to 0.3 g/m² (in dry) was used as a substrate film. The above-mentioned biaxially drawn polyethyleneterephthalate film was attached to a delivery roll of a winding type vacuum depositing device, and then delivered. A deposited silicon oxide film having a thickness of 30 nm was formed by spraying silicon monoxide (SiO) from a source onto the coated surface of the biaxially drawn polyethyleneterephthalate film while feeding oxygen gas, by the vacuum depositing method based on the electron beam (EB) heating method, under the following vapor depositing conditions:

(Vapor Depositing Conditions)

Degree of vacuum in vapor depositing chamber: $1.33 \times 10^{-2}$ Pa ($1 \times 10^{-4}$ Torr)

Degree of vacuum in winding chamber: $1.33 \times 10^{-2}$ Pa

Electron beam power: 25 kW

As is clear from the result of measurement shown in Table 7, the barrier-forming film of the present invention showed an improvement of the vapor-deposited silicon oxide film provided on the substrate film through the heating treatment, and changes in properties such as steam permeability, oxygen permeability, degree of yellowing of color tone, amount of change in X-value of silicon oxide expressed by a formula SiOx composing the vapor-deposited film, surface roughness of the vapor-deposited film, and thermal shrinkage of the substrate film, and the possibility to form a reformed vapor-deposited silicon oxide film was confirmed.

Reference Example 7

(1) A transparent resin primer agent layer having a thickness of from 0.7 to 0.8 g/m² (in dry) was formed by coating a primer agent containing a polyester resin (glass transition point: 67° C.; molecular weight: 18,000) as a main constituent of vehicle, and further containing ethyl acetate as a diluent solvent by the gravure roll coating method onto the surface of the vapor-deposited silicon oxide film of the barrier-forming film manufactured through the heating treatment under conditions including a temperature of 90° C. and a time of 24 hours in the above-mentioned Example 7, and then, applying a heating treatment at 80° C. for a minute.

Then, after forming a desired printed pattern on the surface of the transparent resin primer agent layer formed as above, a double-liquid hardening type polyurethane laminating adhesive was coated by the gravure roll coating method onto the entire surface including the printed pattern so as to achieve a thickness of 4.0 g/m² (in dry). Then, the same was dried to form a laminating adhesive layer. Then, a 15 μm-thick biaxially drawn nylon 6 film was placed on the surface of the laminating adhesive layer so that the corona-treated surfaces face each other, and then, the both were dry-laminated.

Then, after applying a corona discharge treatment to the surface of the thus laminated biaxially drawn nylon 6 film, the double-liquid hardening type polyurethane laminating adhesive was coated on the corona-treated surface by the gravure roll coating method so as to achieve a thickness of 4.0 g/m² (in dry), thereby forming a laminating adhesive layer.

Then, a 60 μm-thick non-drawn polypropylene film was dry-laminated onto the thus formed laminating adhesive layer, thereby manufacturing a laminated member.

(2) Then, two laminated members manufactured as above were provided. The two members were piled up so that the non-drawn polypropylene film surfaces face each other, and then, the outer peripheral edges were three-side-sealed to form a sealing portion, thereby manufacturing a three-side-sealed type soft packaging pouch having an opening on the top.

The three-side-sealed type soft packaging pouch was filling-packaged with water through the opening, thereby manufacturing a packaging semi-product by heat-sealing the opening. Then, the thus manufactured packaging semi-product was placed in a retort kettle, and a retort treatment was applied under retort treatment conditions including a temperature of 120° C. and a pressure of 2.1 kgf/cm².G, and a time of 30 minutes, thereby manufacturing a retort packaged food product.

The packaging bag of the thus manufactured retort-packaged food was excellent in heat resistance, pressure resistance, water resistance, barrier-formability, heat sealability, excellent in barrier-formability against oxygen and steam, free from bag breakage or leakage of contents, and excellent in functions as a food container such as filling-packaging adaptability of contents, distribution adaptability and storage adaptability.

Before the retort treatment, the barrier-formability was represented by an oxygen permeability of 0.41 cc/m²/day.23° C.90% RH, and a steam permeability of 0.23 g/m²/day.40° C.90% RH, and after the retort treatment, by an oxygen permeability of 0.58 cc/m²/day.23° C.90% RH, and a steam permeability of 0.65 g/m²/day.40° C.90% RH.

Barrier-forming films manufactured as in Example 7 but under other heating conditions showed substantially the same result as above.

INDUSTRIAL APPLICABILITY

As is evident from the above description, in the present invention, attention was given to the fact that, by by subjecting a transparent barrier-forming film having a vapor-deposited film of an inorganic oxide such as silicon oxide or aluminum oxide formed on one side of a substrate film such as a biaxially drawn polyethyleneterephthalate film or a biaxially drawn nylon film to an annealing treatment comprising a heating treatment, the substrate film thermally shrinks, and there occurs a change in color tone of yellowish or yellow-brownish color of the vapor-deposited inorganic oxide film. A transparent barrier-forming film was therefore manufactured by forming a vapor-deposited film of an inorganic oxide such as silicon oxide or aluminum oxide on one side of the substrate film comprising the above-mentioned biaxially drawn polyethyleneterephthalate film or biaxially drawn nylon film, and then, the transparent barrier-forming film was subjected to an annealing treatment comprising a heating treatment of setting a heating treatment temperature of at least room temperature and holding the same in an oven for 24 hours. As a result, the substrate film forming the transparent barrier-forming film shrank, and the vapor-deposited inorganic oxide film became denser. Furthermore, the yellowish or yellow-brownish color tone of the vapor-deposited inorganic oxide film upon film forming changed: the degree of yellowing was improved from the yellowish or yellow-brownish color tone, increasing transparency, and the amount of change in X-value of the inorganic oxide such as silicon oxide or aluminum oxide, as expressed by a formula MOx (where, M represents a metal element; and the range of X-value varies with the metal element) composing the vapor-deposited inorganic oxide film increases. In addition, the surface roughness of the vapor-deposited inorganic oxide film changes also. As a barrier-forming material forming a packaging container, there is a remarkable improvement of barrier-formability which prevents permeation of oxygen gas or steam. It is thus possible to manufacture a barrier-forming film useful for manufacturing various packaging containers.

The invention claimed is:

1. A manufacturing method of a barrier-forming film comprising the steps of providing a vapor-deposited inorganic oxide film on a face of a substrate film, and applying an annealing treatment to the substrate film having said vapor-deposited inorganic oxide film, wherein said substrate film comprises a resinous film which selected from a group consisting of polyesters, polyamides and polypropylenes; and wherein said annealing treatment comprises a heating treatment carried out at a temperature within the range from 55° C. to 150° C. in order to cause thermal shrinkage of the substrate film and to increase density of the vapor-deposited inorganic oxide film.

2. A manufacturing method of a barrier-forming film according to claim 1, wherein said vapor-deposited inorganic oxide film comprises a vapor-deposited silicon oxide film or a vapor-deposited aluminum oxide film.

3. A manufacturing method of a barrier-forming film according to claim 2, wherein said substrate film to be treated has a residual stress of being in the range of from 0.1 to 1%, and wherein the thermal shrinkage of the substrate caused by the treatment is in the range of from −0.001 to −1.0% in at least any one of the flow direction and the width direction upon forming the film.

4. A manufacturing method of a barrier-fanning film according to claim 1, wherein said heating treatment is carried out for a heating treatment time within a range of from 30 minutes to five days.

5. A manufacturing method of a barrier-forming film according to claim 4, wherein said substrate film to be treated has a residual stress of being in the range of from 0.1 to 1%, and wherein the thermal shrinkage of the substrate caused by the treatment is in the range of from −0.001 to −1.0% in at least any one of the flow direction and the width direction upon forming the film.

6. A manufacturing method of a barrier-forming film according to claim 1, wherein said substrate film to be treated has a residual stress of being in the range of from 0.1 to 1%, and wherein the thermal shrinkage of the substrate caused by the treatment is in the range of from −0.001 to −1.0% in at least any one of the flow direction and the width direction upon forming the film.

* * * * *